(12) United States Patent
Huang

(10) Patent No.: US 11,688,772 B2
(45) Date of Patent: Jun. 27, 2023

(54) SEMICONDUCTOR DEVICE WITH CONTACT HAVING TAPERED PROFILE AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 149 days.

(21) Appl. No.: 17/331,144

(22) Filed: May 26, 2021

(65) Prior Publication Data

US 2022/0384575 A1    Dec. 1, 2022

(51) Int. Cl.
*H01L 29/10* (2006.01)
*H01L 29/66* (2006.01)

(52) U.S. Cl.
CPC ...... *H01L 29/1054* (2013.01); *H01L 29/1095* (2013.01); *H01L 29/6656* (2013.01)

(58) Field of Classification Search
CPC ............. H01L 29/1054; H01L 29/1095; H01L 29/6656; H01L 21/823871; H01L 21/823475; H01L 29/66772; H01L 21/76804; H01L 23/53295; H01L 27/088; H01L 29/66575; H01L 29/665

See application file for complete search history.

(56) References Cited

U.S. PATENT DOCUMENTS

2022/0102199 A1*    3/2022    Hsiung ............. H01L 29/66795

FOREIGN PATENT DOCUMENTS

TW    201946120 A    12/2019

* cited by examiner

*Primary Examiner* — Cuong B Nguyen
(74) *Attorney, Agent, or Firm* — Muncy, Geissler, Olds & Lowe, P.C.

(57) ABSTRACT

The present application discloses a semiconductor device with a contact having tapered profile and a method for fabricating the semiconductor device. The semiconductor device includes a substrate having a first region and a second region; a first gate structure positioned on the first region; and a second gate structure positioned on the second region; a first contact including a first lower portion positioned on a top surface of the first gate structure, and a first upper portion positioned on the first lower portion; and a second contact including a second lower portion positioned on a top surface of the second gate structure and a sidewall of the second gate structure, and a second upper portion positioned on the second lower portion. Sidewalls of the first lower portion are tapered and sidewalls of the second lower portion are substantially vertical.

17 Claims, 18 Drawing Sheets

SEMICONDUCTOR DEVICE WITH CONTACT HAVING TAPERED PROFILE AND METHOD FOR FABRICATING THE SAME

TECHNICAL FIELD

The present disclosure relates to a semiconductor device and a method for fabricating the semiconductor device, and more particularly, to a semiconductor device with a contact having tapered profile and a method for fabricating the semiconductor device with the contact having tapered profile.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including a first region and a second region; a first gate structure positioned on the first region of the substrate; and a second gate structure positioned on the second region of the substrate; a first contact including a first lower portion positioned on a top surface of the first gate structure, and a first upper portion positioned on the first lower portion; and a second contact including a second lower portion positioned on a top surface of the second gate structure and a sidewall of the second gate structure, and a second upper portion positioned on the second lower portion. Sidewalls of the first lower portion are tapered and sidewalls of the second lower portion are substantially vertical.

In some embodiments, the semiconductor device includes a first dielectric layer positioned on the first region of the substrate. The first gate structure and the first lower portion are positioned in the first dielectric layer. The first dielectric layer includes atoms including phosphorus, arsenic, antimony, or boron.

In some embodiments, the semiconductor device includes a second dielectric layer positioned on the first dielectric layer. The first upper portion is positioned along the second dielectric layer. The second dielectric layer includes atoms including phosphorus, arsenic, antimony, or boron. A concentration of atoms of the second dielectric layer is greater than a concentration of atoms of the first dielectric layer.

In some embodiments, the semiconductor device includes a third dielectric layer positioned on the second dielectric layer. The third dielectric layer includes atoms including phosphorus, arsenic, antimony, or boron.

In some embodiments, the semiconductor device includes a fourth dielectric layer positioned on the third dielectric layer. The fourth dielectric layer includes atoms including phosphorus, arsenic, antimony, or boron. A concentration of atoms of the fourth dielectric layer is greater than a concentration of atoms of the third dielectric layer.

In some embodiments, the first dielectric layer and the second dielectric layer include a same type of atoms.

In some embodiments, the third dielectric layer and the fourth dielectric layer include a same type of atoms.

In some embodiments, the semiconductor device includes a capping layer covering the first gate structure and the second gate structure. The first lower portion is positioned along the capping layer and contacting the top surface of the first gate structure. The second lower portion is positioned along the capping layer and contacting the top surface of the second gate structure.

In some embodiments, the semiconductor device includes a first dielectric layer positioned on the second region of the substrate. The second gate structure and the second lower portion are positioned in the first dielectric layer.

In some embodiments, the semiconductor device includes a third dielectric layer positioned on the first dielectric layer. The third dielectric layer includes atoms including phosphorus, arsenic, antimony, or boron.

In some embodiments, sidewalls of the first upper portion and sidewalls of the second upper portion are substantially vertical.

In some embodiments, the semiconductor device includes a plurality of gate spacers positioned on the sidewalls of the first gate structure.

In some embodiments, the first gate structure includes a gate insulation layer positioned on the first region of the substrate and a bottom gate conductive layer positioned on the gate insulation layer. The first lower portion is contacting the bottom gate conductive layer.

In some embodiments, the semiconductor device includes an ohmic contact layer positioned between the bottom gate conductive layer and the first lower portion. The ohmic contact layer includes titanium silicide, nickel silicide, nickel platinum silicide, tantalum silicide, or cobalt silicide.

In some embodiments, a thickness of the second dielectric layer is less than a thickness of the first dielectric layer.

In some embodiments, a thickness of the third dielectric layer is greater than a thickness of the second dielectric layer.

In some embodiments, a thickness of the fourth dielectric layer is greater than a thickness of the second dielectric layer.

In some embodiments, an element density of the first region of the substrate is greater than an element density of the second region of the substrate.

Another aspect of the present disclosure provides a method for fabricating a semiconductor device including providing a substrate including a first region and a second region; forming a gate structure on first region of the substrate and a second gate structure on the second region of the substrate; forming a first dielectric layer on the substrate to cover the first gate structure; forming a second dielectric layer on the first dielectric layer and above the first region of the substrate; forming a first contact including a first lower portion along the first dielectric layer and contacting a top surface of the first gate structure, and a first upper portion along the second dielectric layer and on the first lower portion; and forming a second contact including a second lower portion contacting a top surface of the second gate structure and a sidewall of the second gate structure, and a second upper portion on the second lower portion. The first dielectric layer includes atoms including phosphorus, arsenic, antimony, or boron. Sidewalls of the first lower portion are tapered and sidewalls of the second lower portion are substantially vertical.

In some embodiments, the method for fabricating the semiconductor device includes steps of forming a third dielectric layer on the second dielectric layer and forming a fourth dielectric layer positioned on the third dielectric layer. The third dielectric layer includes atoms including phosphorus, arsenic, antimony, or boron. The fourth dielectric layer includes atoms including phosphorus, arsenic, antimony, or boron. A concentration of atoms of the second dielectric layer is greater than a concentration of atoms of the first dielectric layer. A concentration of atoms of the fourth dielectric layer is greater than a concentration of atoms of the third dielectric layer.

Due to the design of the semiconductor device of the present disclosure, the tapered profile of the contacts fabricated by designated dielectric layers with different concentration of atoms and stack configuration may reduce leakage current between adjacent elements at the first region (i.e., the tight region). As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
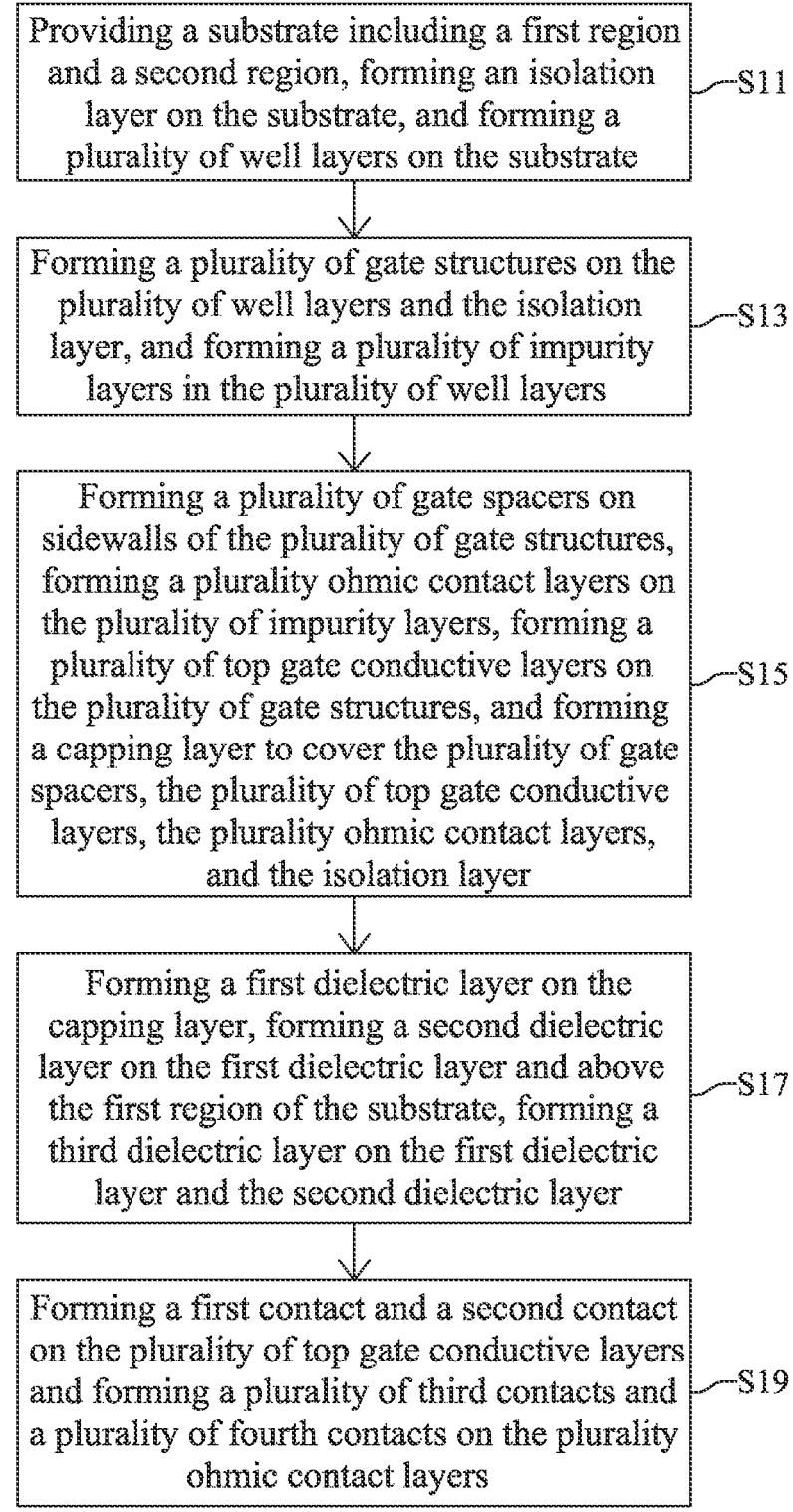
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms.

Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
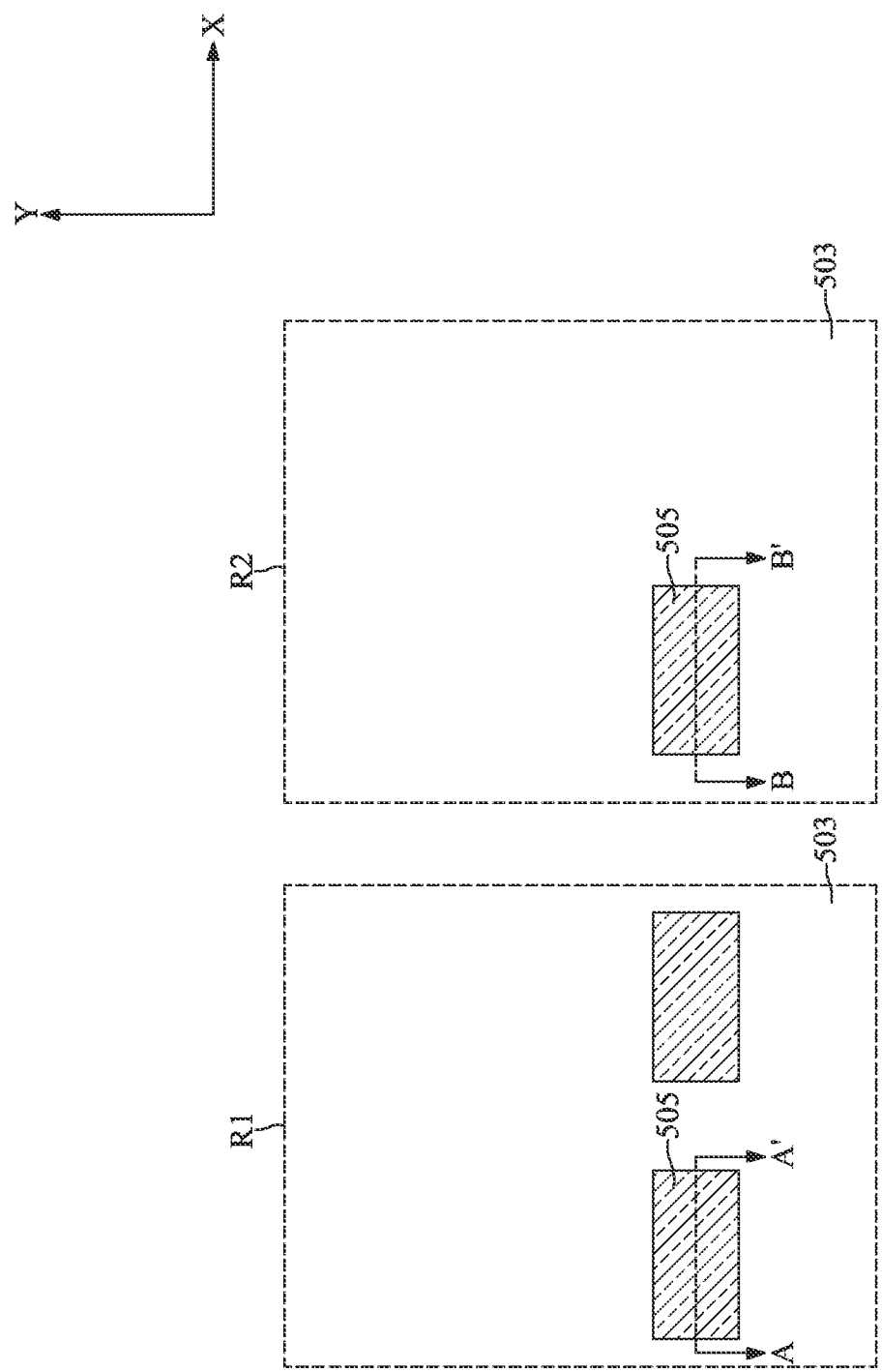
FIG. 2 illustrates, in a schematic top-view diagram, an intermediate semiconductor device in accordance with one embodiment of the present disclosure.
Figure 3:
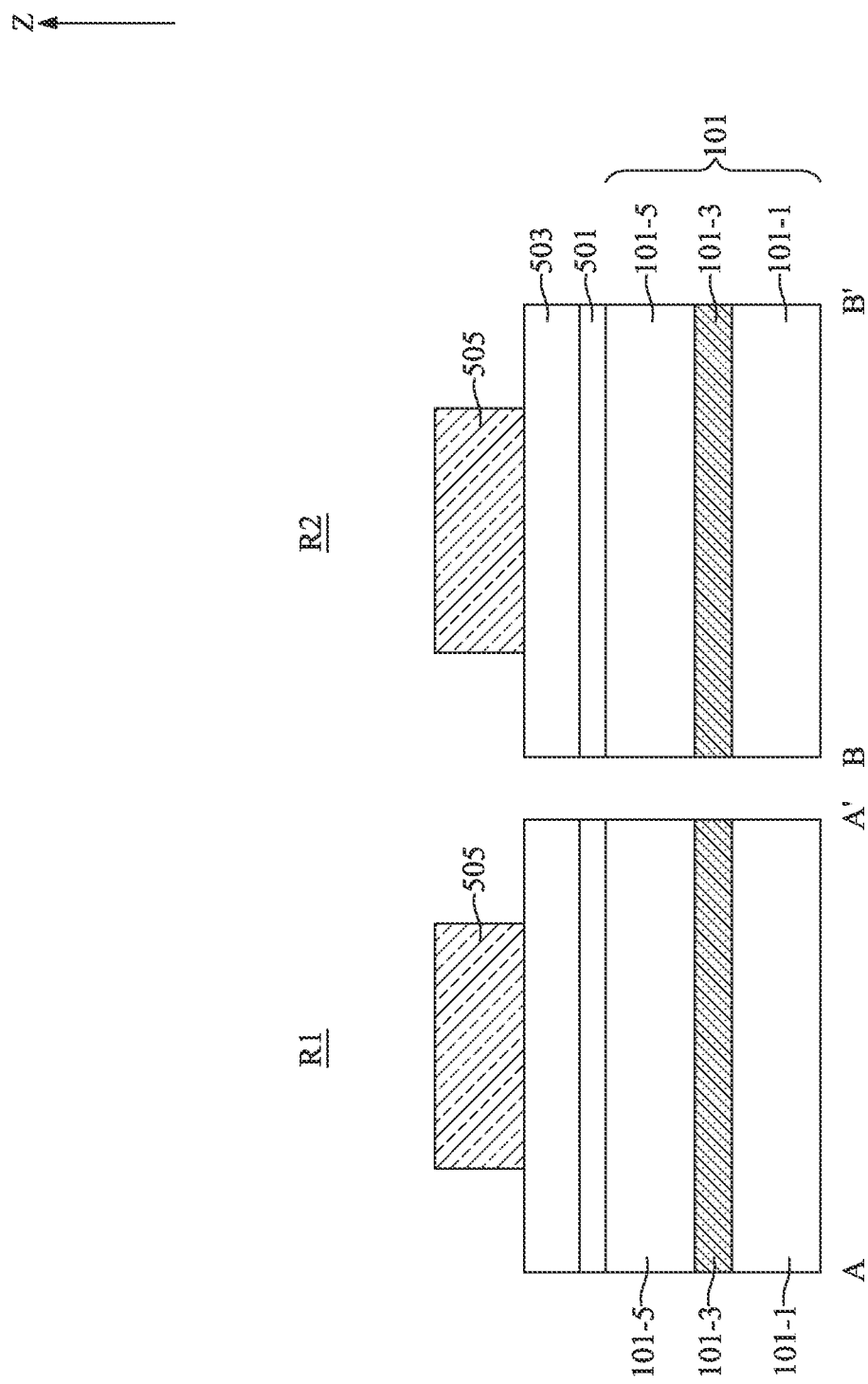
FIG. 3 is a schematic cross-sectional view diagram taken along lines A-A' and B-B' n FIG. 2, respectively.
Figure 4:
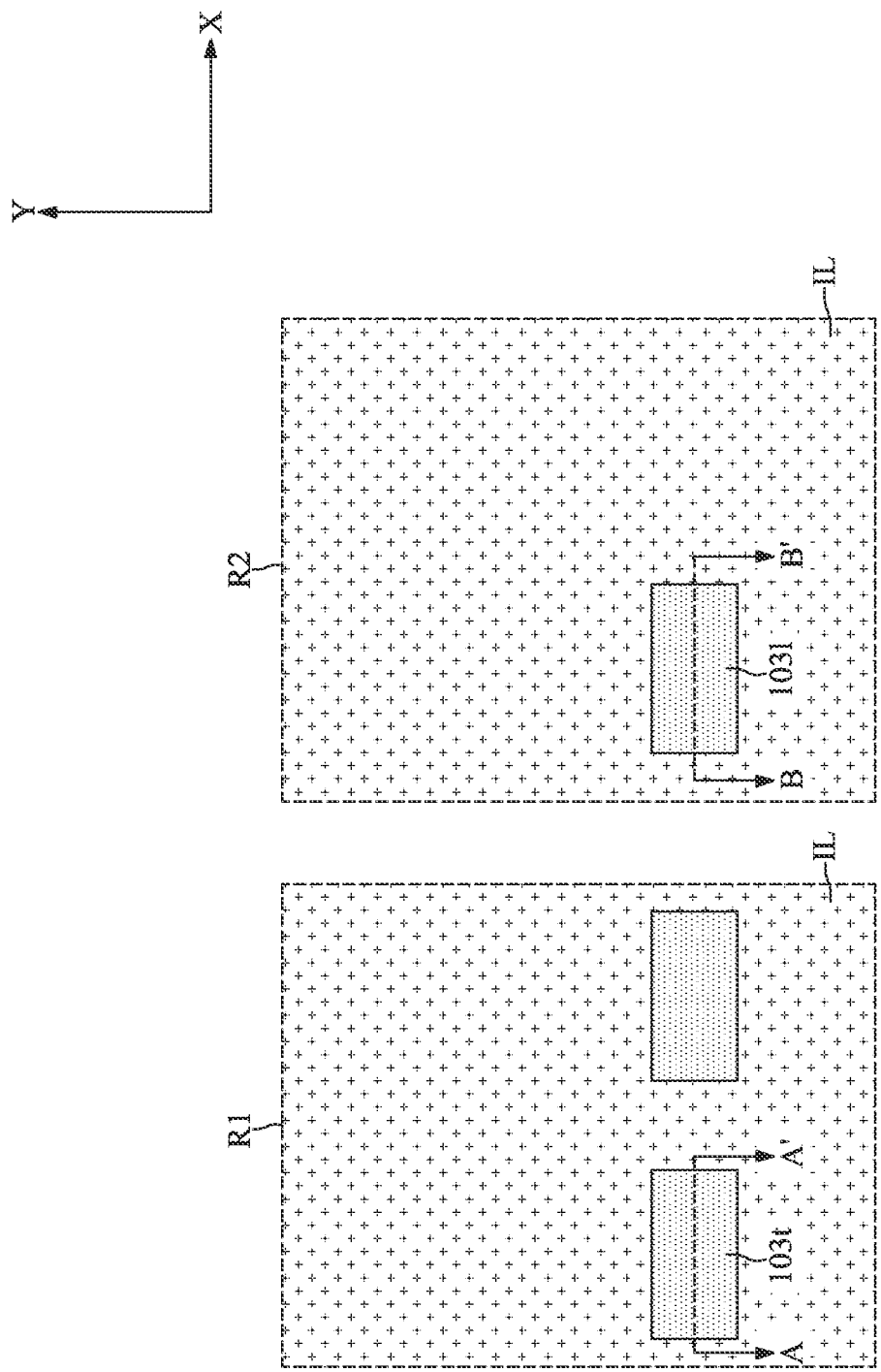
FIG. 4 illustrates, in a schematic top-view diagram, an intermediate semiconductor device in accordance with one embodiment of the present disclosure.
Figure 5:
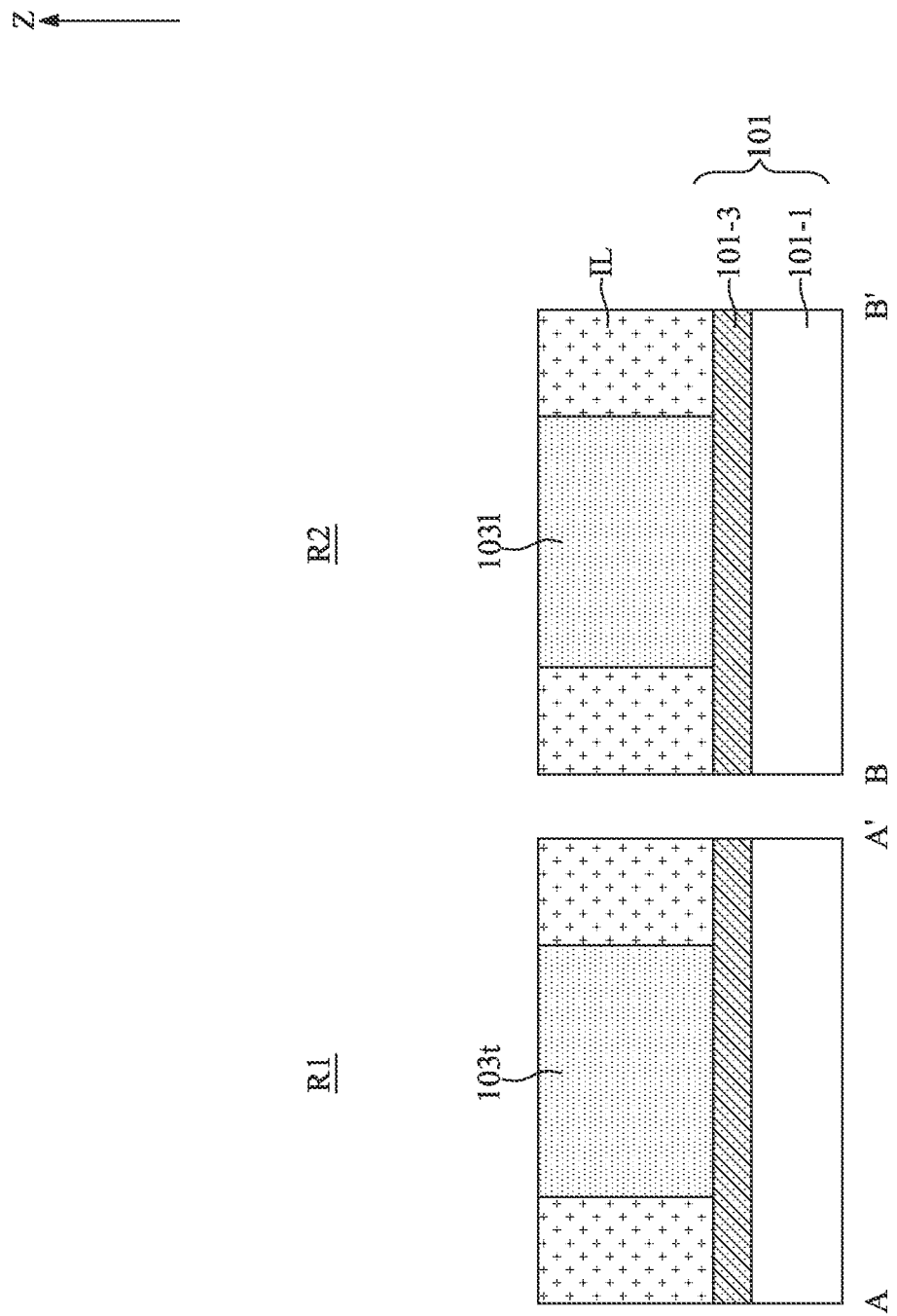
FIG. 5 is a schematic cross-sectional view diagram taken along lines A-A' and B-B' in FIG. 4, respectively.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along lines A-A' and B-B' n FIG. 2, respectively. FIG. 4 illustrates, in a schematic top-view diagram, an intermediate semiconductor device in accordance with one embodiment of the present disclosure. FIG. 5 is a schematic cross-sectional view diagram taken along lines A-A' and B-B' in FIG. 4, respectively.

With reference to FIGS. 1 to 5, at step S11, a substrate 101 including a first region R1 and a second region R2 may be provided, an isolation layer IL may be formed on the substrate 101, and a plurality of well layers 103*t*, 103*l* may be formed on the substrate 101.

With reference to FIGS. 2 and 3, the substrate 101 may be a wafer or a die and the substrate 101 may include the first region R1 and the second region R2. In some embodiments, the first region R1 and the second region R2 may be next to each other. In some embodiments, the first region R1 and the second region R2 may be both at the central area of the wafer. In some embodiments, the first region R1 and the second region R2 may be both at the peripheral area of the wafer. In some embodiments, the first region R1 may be at the central area of the wafer and the second region R2 may be at the peripheral area of the wafer, or vice versa.

It should be noted that, in the description of the present disclosure, the first region R1 may comprise a portion of the substrate 101 and spaces above and under the portion of the substrate 101. Describing an element as being disposed on the first region R1 means that the element is disposed on a top surface of the portion of the substrate 101. Describing an element as being disposed in the region R1 means that the element is disposed in the portion of the substrate 101; however, a top surface of the element may be even with the top surface of the portion of the substrate 101. Describing an element as being disposed above the first region R1 means that the element is disposed above the top surface of the portion of the substrate 101. Accordingly, the second region R2 may comprise another portion of the substrate 101 and spaces above and under the other portion of the substrate 101.

With reference to FIGS. 2 and 3, the substrate 101 may be a semiconductor-on-insulator (SOI) substrate. The SOI substrate may include a handle layer 101-1, a buried insulator layer 101-3, and a top semiconductor layer 101-5. Portions of the top semiconductor layer 101-5 will be subsequently processed into a plurality of well layers 103*t*, 103*l* shown in FIGS. 4 and 5.

In some embodiments, the handle layer 101-1 may be composed of at least one semiconductor material, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor. When the handle layer 101-1 is composed of at least one semiconductor material, the at least one semiconductor material that provides the handle layer 101-1 may be single crystalline, polycrystalline, or amorphous. In one example, the handle layer 101-1 is composed of single crystalline silicon or a single crystalline silicon germanium alloy.

In some embodiments, the buried insulator layer 101-3 may be a crystalline or non-crystalline dielectric material such as an oxide and/or nitride. In one example, the buried insulator layer 101-3 may be a dielectric oxide such as, for example, silicon dioxide. In another example, the buried insulator layer 101-3 may be a dielectric nitride such as, for example, silicon nitride or boron nitride. In yet another example, the buried insulator layer 101-3 may include a stack of a dielectric oxide and a dielectric nitride. Specifically, a stack of, in any order, silicon dioxide and silicon nitride or boron nitride may be employed as the buried insulator layer 101-3. The buried insulator layer 101-3 may have a thickness from 10 nm to 200 nm, although other thicknesses that are lesser than, or greater than, the aforementioned thickness range may also be employed as the thickness of the buried insulator layer 101-3.

The top semiconductor layer 101-5 may include at least one semiconductor material, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VT compound semiconductor.

The semiconductor material that provides the top semiconductor layer 101-5 may be a relaxed semiconductor material or a strained semiconductor material. In one embodiment, the semiconductor material that provides the top semiconductor layer 101-5 may include a same semiconductor material as the handle layer 101-1. In one example, silicon is employed as the semiconductor material for both the handle layer 101-1 and the top semiconductor layer 101-5. In another embodiment, the top semiconductor layer 101-5 may include a semiconductor material that differs from a semiconductor material that provides the handle layer 101-1. In one example, the handle layer 101-1 may be composed of silicon, while the top semiconductor layer 101-5 may be composed of a silicon germanium alloy.

The top semiconductor layer 101-5 may have a thickness from nm to 100 nm, although other thicknesses that are lesser than, or greater than, the aforementioned thickness range may also be employed as the thickness of the top semiconductor layer 101-5.

In some embodiments, the substrate 101 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIGS. 2 and 3, a series of deposition processes may be performed to deposit a pad oxide layer 501 on the top semiconductor layer 101-5 and a pad nitride layer 503 on the pad oxide layer 501. The pad oxide layer 501 may be formed of, for example, silicon oxide. The pad nitride layer 503 may be formed of, for example, silicon nitride. A photolithography process may be performed to form a first mask layer 505 on the pad nitride layer 503. The first mask layer 505 may be a photoresist layer and may define the position and pattern of the isolation layer IL.

With reference to FIGS. 4 and 5, an etch process, such as an anisotropic dry etch process, may be performed to remove the pad oxide layer 501, the pad nitride layer 503, and the top semiconductor layer 101-5 not covered by the first mask layer 505 so as to form trenches penetrating through the pad oxide layer 501, the pad nitride layer 503, and the top semiconductor layer 101-5. After the etch process, the first mask layer 505 may be removed. An insulating material may be deposited into the trenches and a planarization process, such as chemical mechanical polishing, may be subsequently performed to remove excess filling material until the remained top semiconductor layer 101-5 is exposed. The insulating material may be, for example, silicon oxide, silicon nitride, silicon oxynitride, silicon nitride oxide, or fluoride-doped silicate.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 4 and 5, the plurality of well layers 103*t*, 103*l* may be turned from the remained top semiconductor layer 101-5 by an implantation process. The dopants of the implantation process may include p-type impurities (dopants) or n-type impurities (dopants). The p-type impurities may be added to an intrinsic semiconductor to create deficiencies of valence electrons. In a silicon-containing substrate, examples of p-type dopants, i.e., impurities include but are not limited to boron, aluminum, gallium, and indium. The n-type impurities may be added to an intrinsic semiconductor to contribute free electrons to the intrinsic semiconductor. In a silicon-containing substrate, examples of n-type dopants, i.e., impurities, include but are not limited to antimony, arsenic, and phosphorous. After the implantation process, the plurality of well layers 103*t*, 103*l* may have an electrical type such as n-type or p-type. In some embodiments, the plurality of well layers 103*t*, 103*l* may have a same electrical type but are not limited thereto.

In some embodiments, an anneal process may be performed to activate the plurality of well layers 103*t*, 103*l*. The temperature of the anneal process may be between about 800° C. and about 1250° C. The anneal process may have a process duration between about 1 millisecond and about 500 milliseconds. The anneal process may be, for example, a rapid thermal anneal, a laser spike anneal, or a flash lamp anneal.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 6:
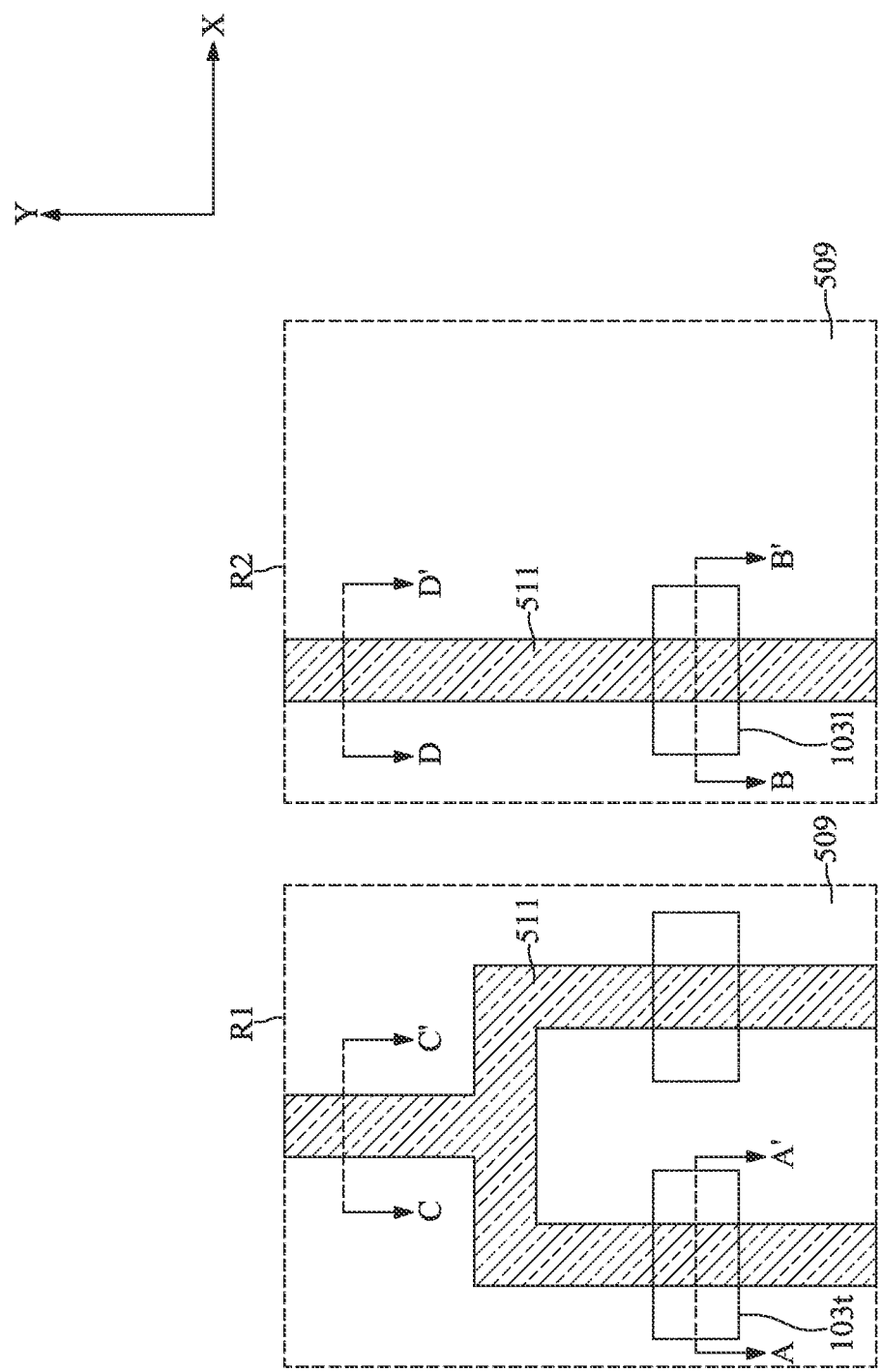
FIG. 6 illustrates, in a schematic top-view diagram, an intermediate semiconductor device in accordance with one embodiment of the present disclosure.
Figure 7:
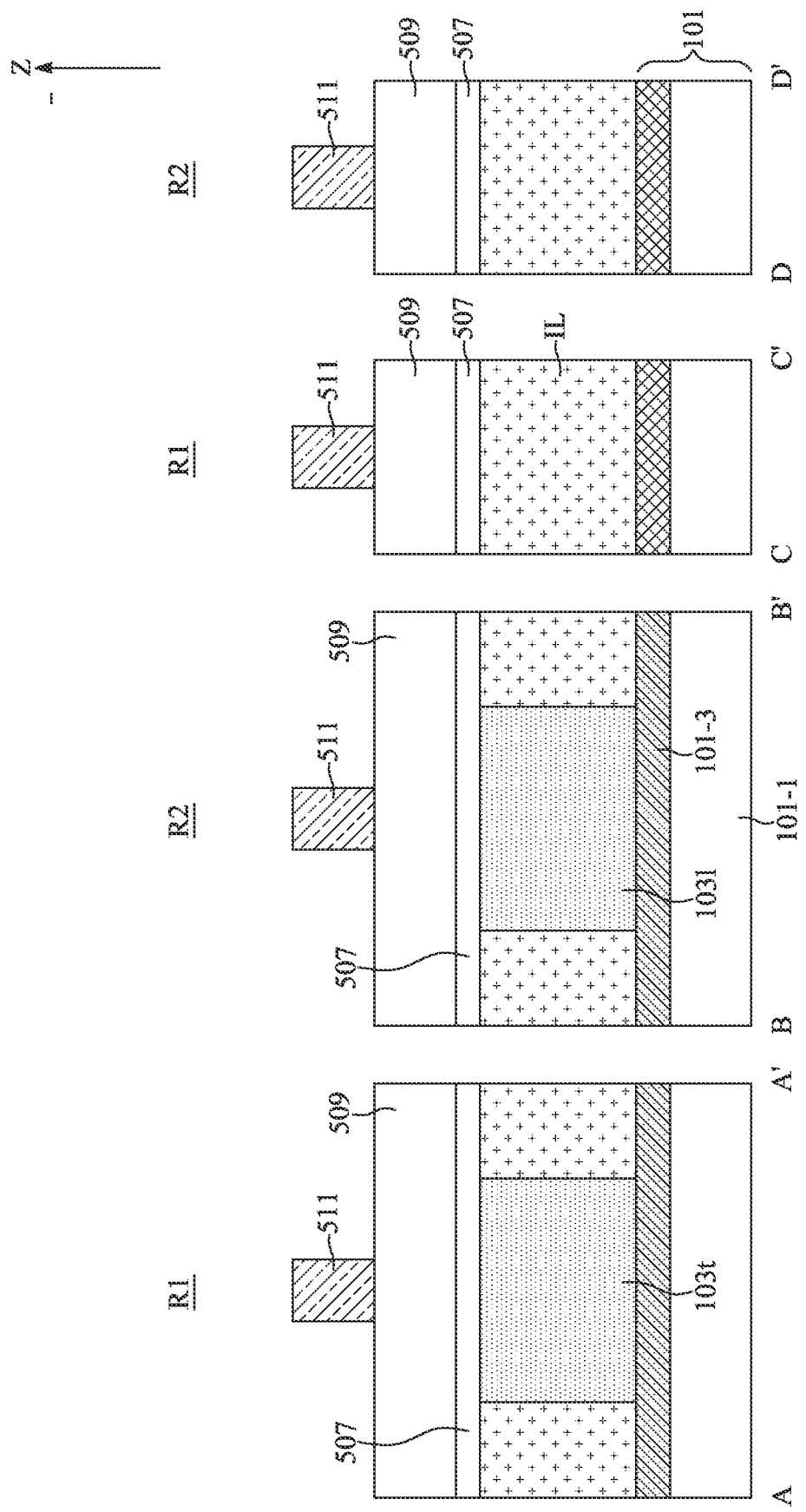
FIG. 7 is a schematic cross-sectional view diagram taken along lines A-A', B-B', C-C', and D-D' in FIG. 6, respectively.
Figure 8:
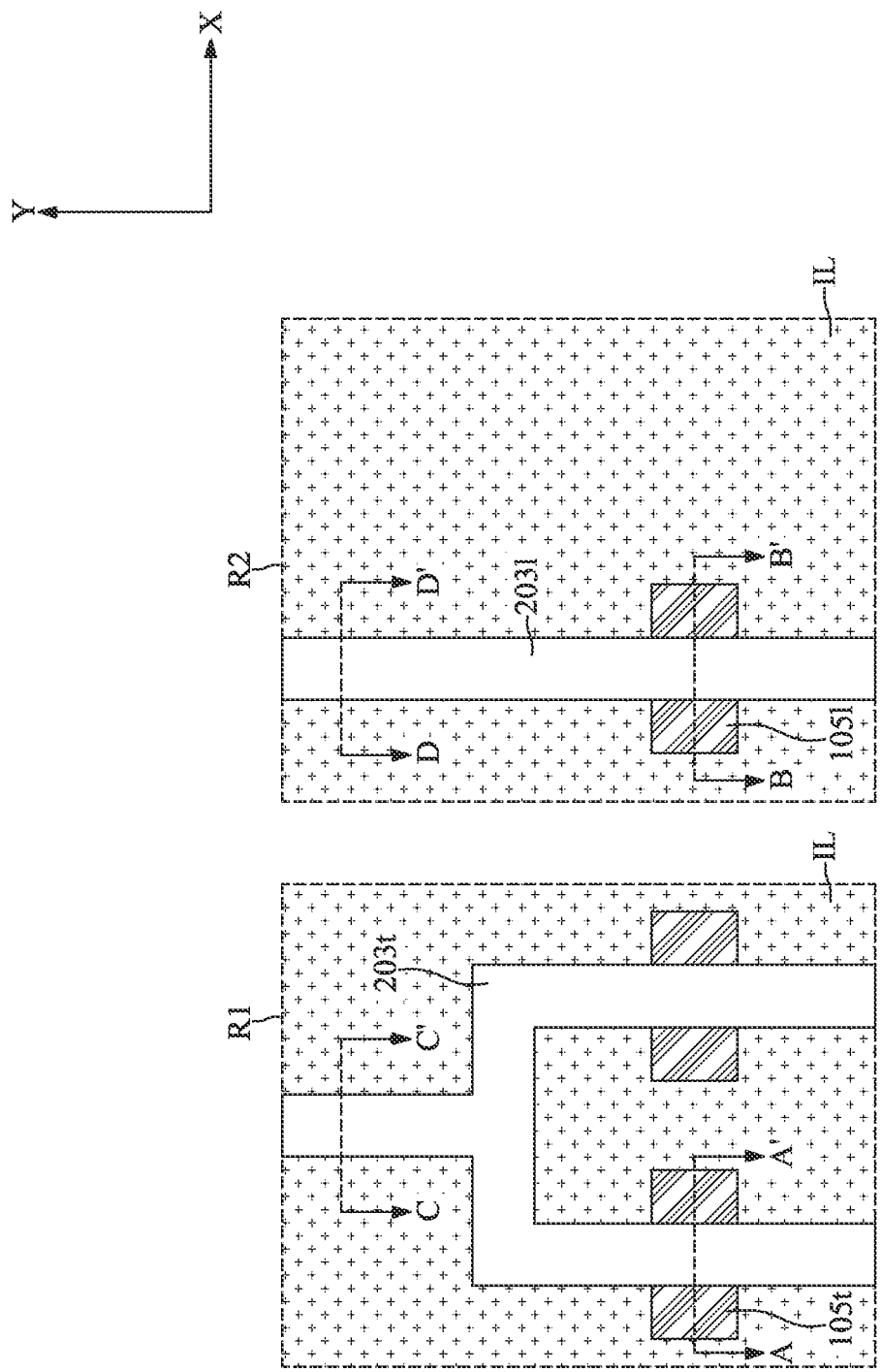
FIG. 8 illustrates, in a schematic top-view diagram, an intermediate semiconductor device in accordance with one embodiment of the present disclosure.
Figure 9:
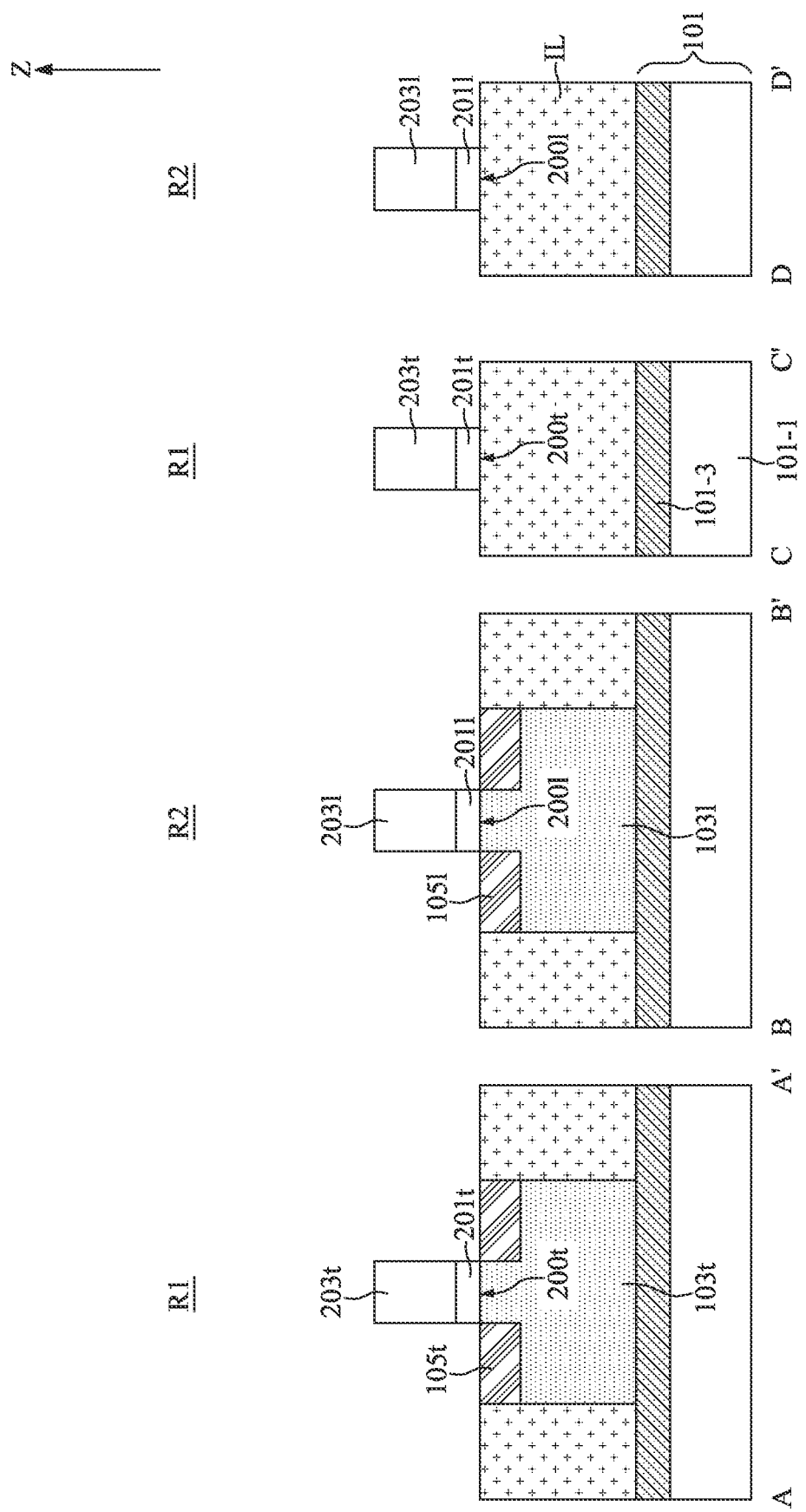
FIG. 9 is a schematic cross-sectional view diagram taken along lines A-A', B-B', C-C', and D-D' in FIG. 8, respectively.

FIG. 6 illustrates, in a schematic top-view diagram, an intermediate semiconductor device in accordance with one embodiment of the present disclosure. FIG. 7 is a schematic cross-sectional view diagram taken along lines A-A', B-B', C-C', and D-D' in FIG. 6, respectively. FIG. 8 illustrates, in a schematic top-view diagram, an intermediate semiconductor device in accordance with one embodiment of the present disclosure. FIG. 9 is a schematic cross-sectional view diagram taken along lines A-A', B-B', C-C', and D-D' in FIG. 8, respectively.

With reference to FIG. 1 and FIGS. 6 to 9, at step S13, a plurality of gate structures 200*t*, 200*l* may be formed on the plurality of well layers 103*t*, 103*l* and the isolation layer IL, and a plurality of impurity layers 105*t*, 105*l* may be formed in the plurality of well layers 103*t*, 103*l*.

With reference to FIGS. 6 and 7, a layer of first insulation material 507 may be formed to cover the isolation layer IL and the plurality of well layers 103*t*, 103*l*. The layer of first insulation material 507 may be formed by a deposition process such as chemical vapor deposition, plasma enhanced chemical vapor deposition, or the like. The layer of first insulation material 507 may have a thickness between about 0.5 nm and about 5.0 nm. Preferably, the thickness of the layer of first insulation material 507 may be between about 0.5 nm to about 2.5 nm. It should be noted that, the thickness of the layer of first insulation material 507 may be set to an arbitrary range depending on the circumstances.

In some embodiments, the first insulation material 507 may be, for example, silicon oxide. In some embodiments, the first insulation material 507 may, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

Specifically, the first insulation material 507 may be hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In some embodiments, the layer of first insulation material 507 may be a multilayer structure that includes, for example, one layer of silicon oxide and another layer of high-k dielectric material.

With reference to FIGS. 6 and 7, a layer of first conductive material 509 may be formed on the layer of first insulation material 507. The layer of first conductive material 509 may be formed by a deposition process such as chemical vapor deposition, plasma enhanced chemical vapor deposition, sputtering, or other suitable technique. The first conductive material 509 may be, for example, polycrystalline silicon, polycrystalline silicon germanium, or a combination thereof. In some embodiments, the first conductive material 509 may be, for example, copper, tungsten, aluminum, or other suitable conductive metal. A second mask layer 511 may be formed on the layer of first conductive material 509. The second mask layer 511 may be, for example, a photoresist layer. The second mask layer 511 may define the position and pattern of the plurality of gate structures 200$t$, 200$l$.

With reference to FIGS. 8 and 9, an etch process, such as an anisotropic dry etch process, may be performed to remove portions of the layer of first insulation material 507 and the layer of first conductive material 509. After the etch process, the remained portions of the layer of first insulation material 507 and the layer of first conductive material 509 may be respectively turned into the plurality of gate insulation layers 201$t$, 201$l$ and the plurality of bottom gate conductive layers 203$t$, 203$l$.

Specifically, the gate insulation layer 201$t$ may be formed on the well layer 103$t$, on the isolation layer IL, and above the first region R1 of the substrate 101. The bottom gate conductive layer 203$t$ may be formed on the gate insulation layer 201$t$. The gate insulation layer 201$t$ and the bottom gate conductive layer 203$t$ together configure the gate structure 200$t$. The gate insulation layer 201$l$ may be formed on the well layer 103$l$, on the isolation layer IL, and above the second region R2 of the substrate 101. The bottom gate conductive layer 203$l$ may be formed on the gate insulation layer 201$l$. The gate insulation layer 201$l$ and the bottom gate conductive layer 203$l$ together configure the gate structure 200$l$.

In the description of the present disclosure, the first region R1 may have an element density greater than that of the second region R2. The element density may be a value defined by the number of elements (e.g., gate structures 200$t$, 200$l$) disposed on the first region R1 or the second region R2 divided by surface areas of first region R1 or the second region R2 from a top-view perspective. From a cross-sectional perspective, a greater element density may mean a smaller horizontal distance between adjacent elements. In other words, the first region R1 may be regarded as a dense region and the second region R2 may be regarded as a loose region.

With reference to FIGS. 8 and 9, an implantation process may be performed using the plurality of gate structures 200$t$, 200$l$ as masks to form the plurality of impurity layers 105$t$, and 105$l$. The plurality of impurity layers 105$t$, 105$l$ may be formed adjacent to two sides of the plurality of gate structures 200$t$, 200$l$ and in the plurality of well layers 103$t$, 103$l$. The dopants of the implantation process may be, for example, phosphorus, arsenic, antimony, or boron. In some embodiments, the concentration of dopants within the plurality of impurity layers 105$t$, 105$l$ may be between about $4 \times 10^{20}$ atoms/cm$^3$ and about $2 \times 10^{21}$ atoms/cm$^3$. The plurality of impurity layers 105$t$, 105$l$ may have an electrical type different from the electrical type of the plurality of well layers 103$t$, 103$l$. The impurity layers 105$t$ and the impurity layers 105$l$ may have different electrical types but are not limited thereto.

An annealing process may be performed to activate the plurality of impurity layers 105$t$, 105$l$. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 10:
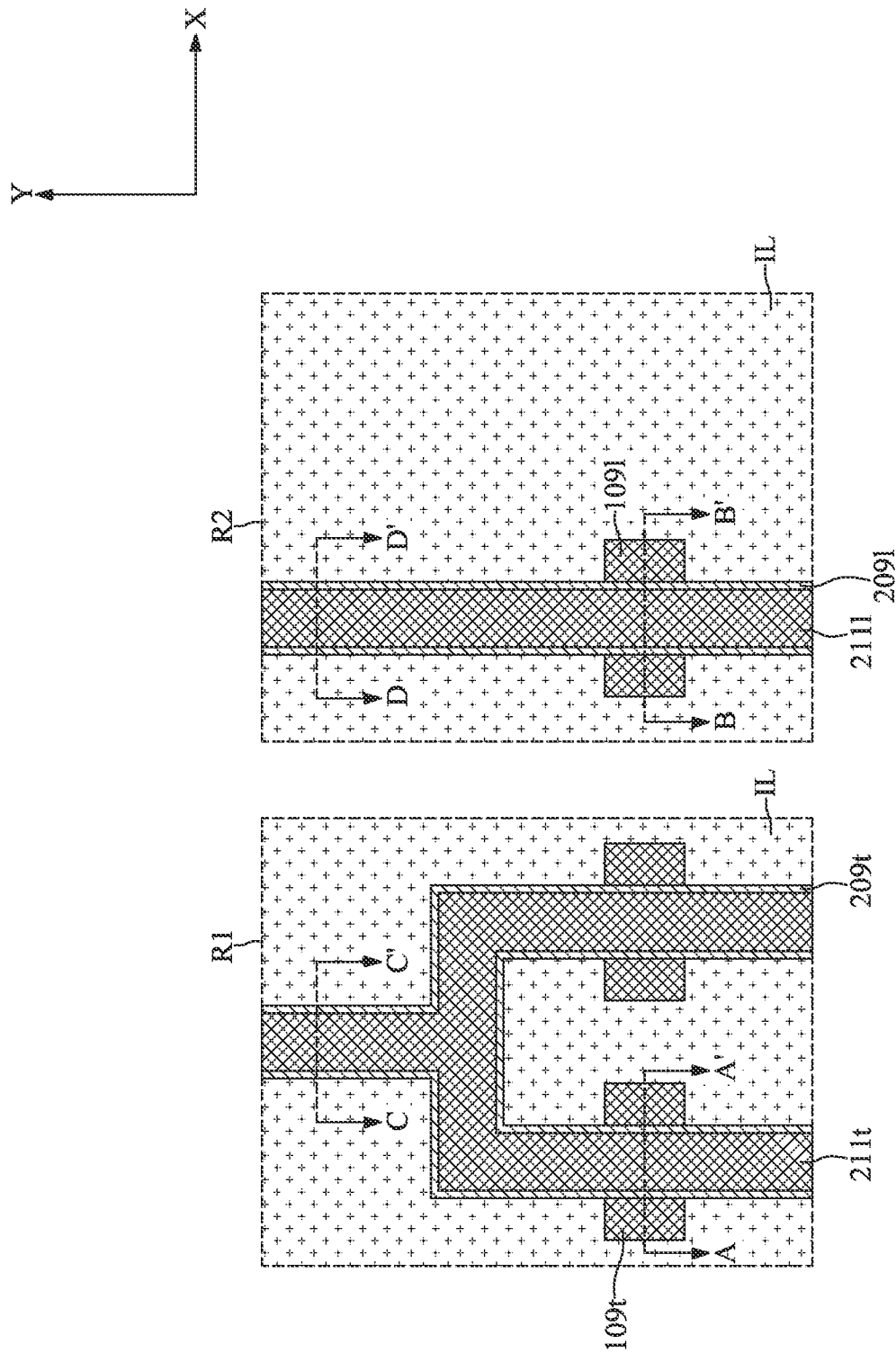
FIG. 10 illustrates, in a schematic top-view diagram, an intermediate semiconductor device in accordance with one embodiment of the present disclosure.
Figure 11:
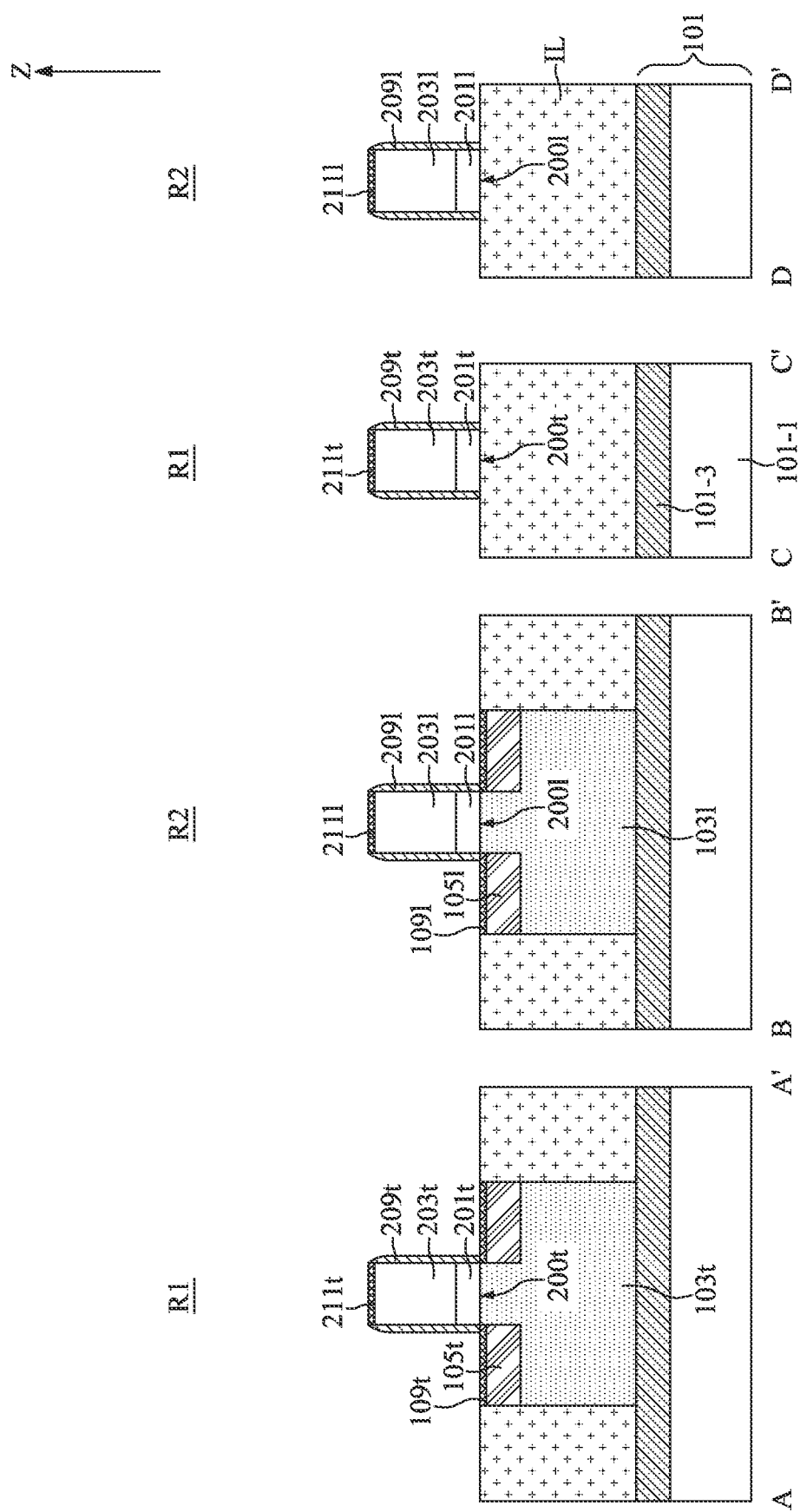
FIG. 11 illustrates, in a schematic cross-sectional view diagram taken along lines A-A', B-B', C-C', and D-D' in FIG. 10, respectively.

FIG. 10 illustrates, in a schematic top-view diagram, an intermediate semiconductor device in accordance with one embodiment of the present disclosure. FIG. 11 illustrates, in a schematic cross-sectional view diagram taken along lines A-A', B-B', C-C', and D-D' in FIG. 10, respectively. FIGS. 12 to 15 illustrate, in schematic cross-sectional view diagrams, part of a flow for fabricating the semiconductor device 1A in accordance with one embodiment of the present disclosure.

With reference to FIG. 1 and FIGS. 10 to 12, at step S15, a plurality of gate spacers 209$t$, 209$l$ may be formed on sidewalls of the plurality of gate structures 200$t$, 200$l$, a plurality ohmic contact layers 109$t$, 109$l$ may be formed on the plurality of impurity layers 105$t$, 105$l$, a plurality of top gate conductive layers 211$t$, 211$l$ may be formed on the plurality of gate structures 200$t$, 200$l$, and a capping layer 111 may be formed to cover the plurality of gate spacers 209$t$, 209$l$, the plurality of top gate conductive layers 211$t$, 211$l$, the plurality ohmic contact layers 109$t$, 109$l$, and the isolation layer IL.

With reference to FIGS. 10 and 11, a layer of insulation material may be formed over the intermediate semiconductor device illustrated in FIG. 9. The layer of insulation material may be formed by, for example, chemical vapor deposition, plasma enhanced chemical vapor deposition, or the like. The insulation material may be, for example, silicon nitride, silicon oxide, silicon oxynitride, silicon nitride oxide, the like, or a combination thereof. An etch process, such as an anisotropic dry etch process, may be performed to remove portions of the layer of insulation material and concurrently form the plurality of gate spacers 209$t$, 209$l$.

With reference to FIGS. 10 and 11, a layer of conductive material may be formed over the substrate 101. The conductive material may include, for example, titanium, nickel, platinum, tantalum, or cobalt. A thermal treatment may be subsequently performed. During the thermal treatment, metal atoms of the layer of conductive material may react chemically with silicon atoms of the plurality of bottom gate conductive layers 203$t$, 203$l$ and the plurality of impurity layers 105$t$, 105$l$ to form the plurality of top gate conductive layers 211$t$, 211$l$ and the plurality ohmic contact layers 109$t$, 109$l$, respectively and correspondingly. The plurality ohmic contact layers 109$t$, 109$l$ and the plurality of top gate conductive layers 211$t$, 211$l$ may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution. The plurality ohmic contact layers 109t, 109l and the plurality of top gate conductive layers 211t, 211l may have a thickness between about 2 nm and about 20 nm and may serve as ohmic contact to reduce the contact resistance of the plurality of impurity layers 105t, 105l and the plurality of bottom gate conductive layers 203t, 203l.

Figure 12:
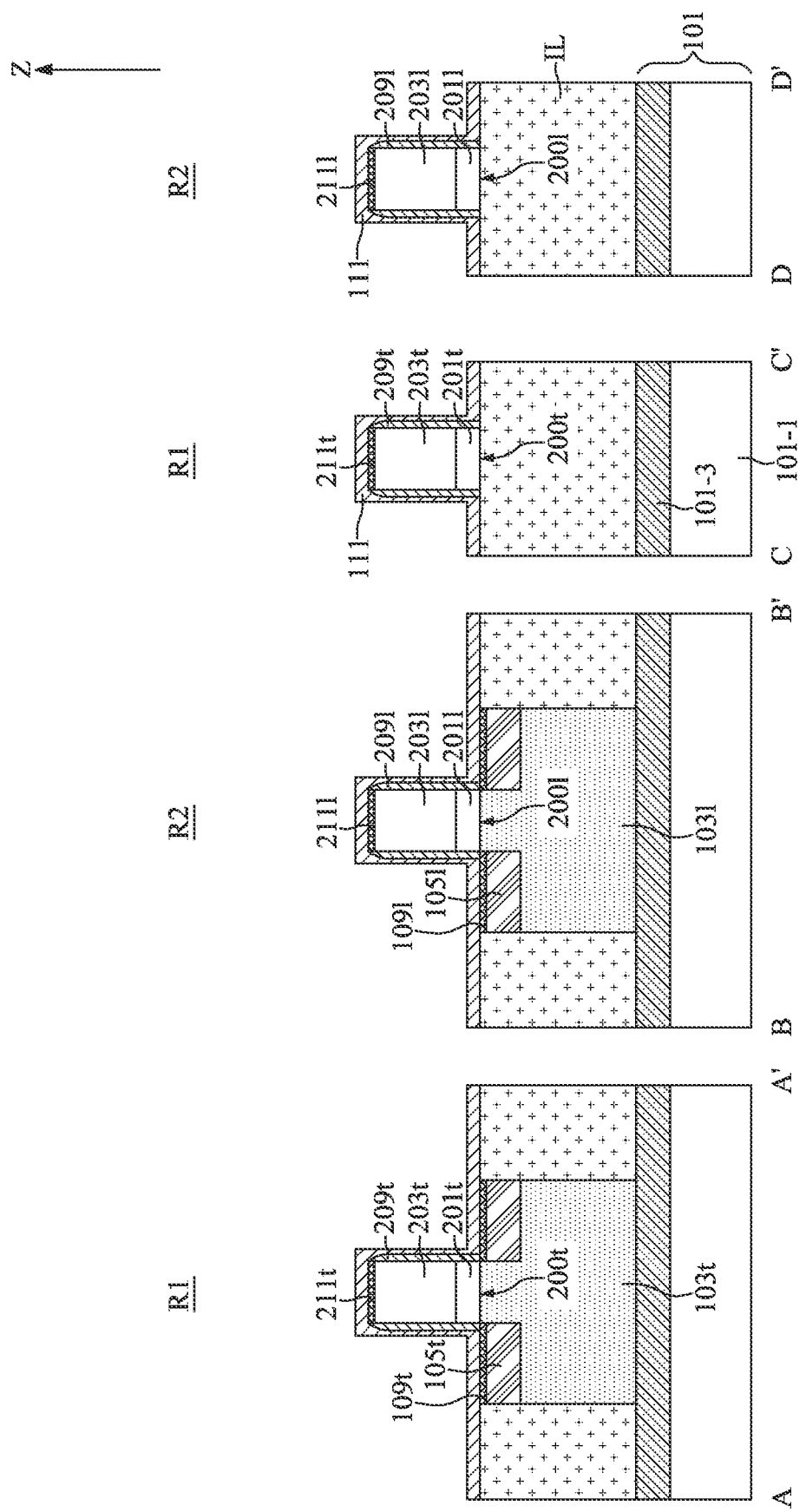
FIGS. 12 to 15 illustrate, in schematic cross-sectional view diagrams, part of a flow for fabricating the semiconductor device in accordance with one embodiment of the present disclosure.

With reference to FIG. 12, the capping layer 111 may be formed over the intermediate semiconductor device illustrated in FIG. 11 to cover the plurality of gate spacers 209t, 209l, the plurality of top gate conductive layers 211t, 211l, the plurality ohmic contact layers 109t, 109l, and the isolation layer IL. The capping layer 111 may be formed by, for example, chemical vapor deposition, plasma enhanced chemical vapor deposition, or the like. The capping layer 111 may be formed of, for example, silicon oxide, silicon nitride, silicon oxynitride, silicon nitride oxide, other semiconductor oxides, other semiconductor nitrides, or a combination thereof.

With reference to FIG. 1 and FIGS. 13 to 15, at step S17, a first dielectric layer 301 may be formed on the capping layer 111, a second dielectric layer 303 may be formed on the first dielectric layer 301 and above the first region R1 of the substrate 101, a third dielectric layer 305 may be formed on the first dielectric layer 301 and the second dielectric layer 303.

Figure 13:
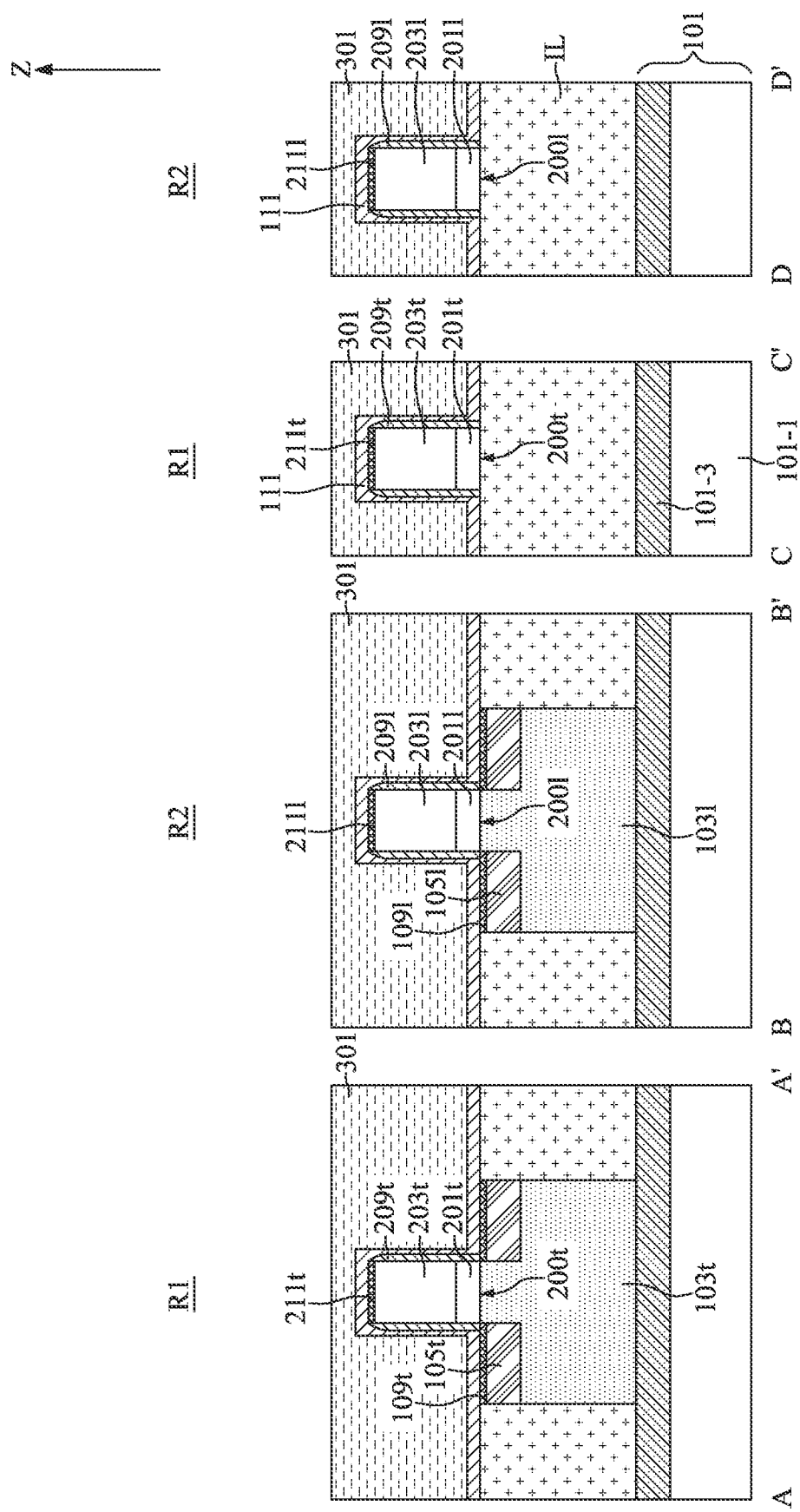

With reference to FIG. 13, the first dielectric layer 301 may be formed over the intermediate semiconductor device illustrated in FIG. 12 to cover the capping layer 111. A planarization process, such as chemical mechanical polishing, may be performed to remove excess material and provide a substantially flat surface for subsequent processing steps. The first dielectric layer 301 may be formed by, for example, chemical vapor deposition, plasma enhanced chemical vapor deposition. In some embodiments, the first dielectric layer 301 may be deposited using a silicate or silicon source, a number of doping sources, and an ozone source. The doping sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the first dielectric layer 301.

In some embodiments, both the first dielectric layer 301 formed above the first region R1 and the second region R2 of the substrate 101 have impurity atoms. In some embodiments, only the first dielectric layer 301 formed above the first region R1 or the second region R2 of the substrate 101 have impurity atoms. In such situation, the first dielectric layer 301 formed above the first region R1 and the first dielectric layer 301 formed above second region R2 may be formed separately with the assistance of mask layers.

Figure 14:
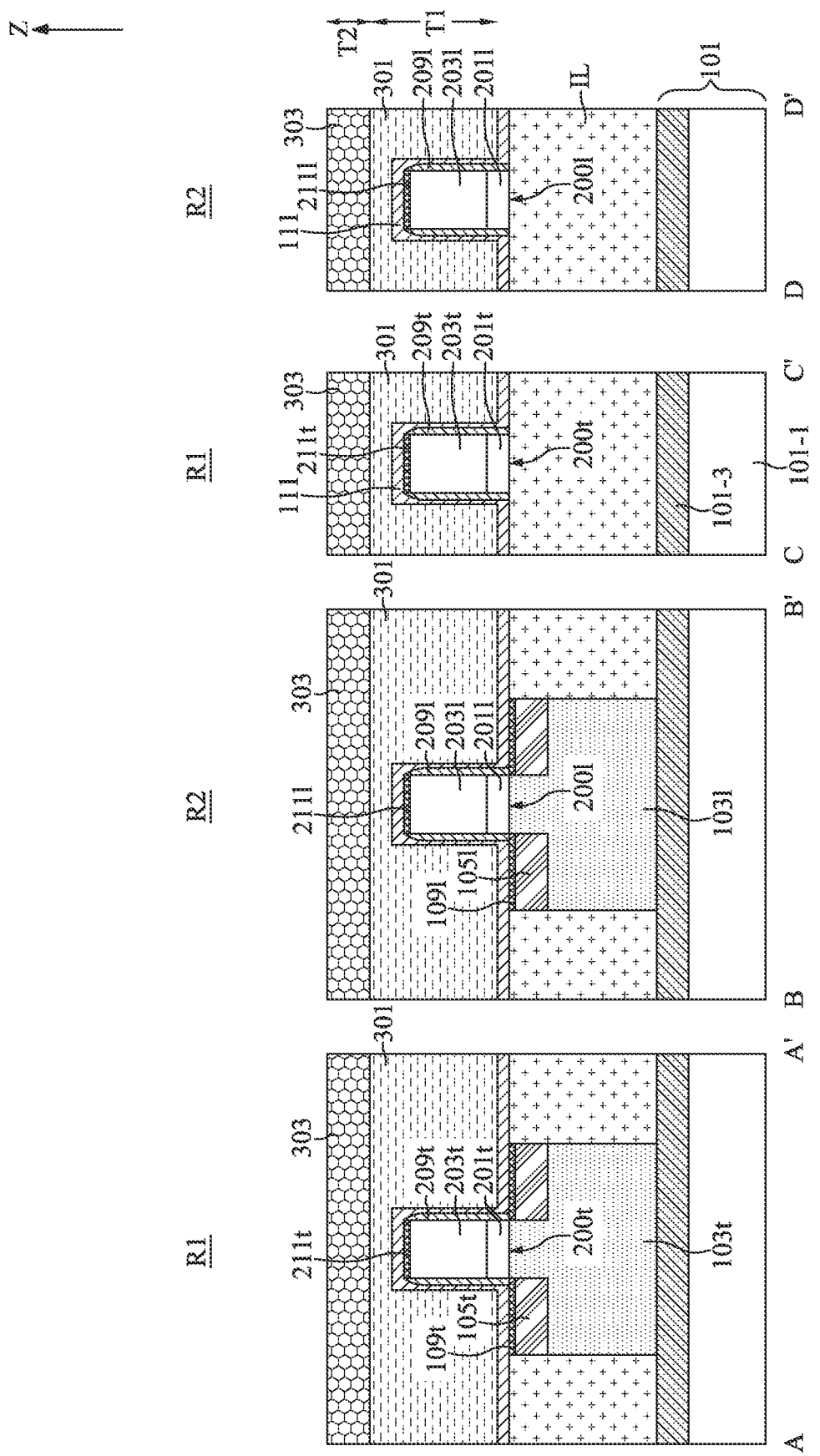

With reference to FIG. 14, the second dielectric layer 303 may be formed on the first dielectric layer 301. In some embodiments, the second dielectric layer 303 may have a thickness T2 less than a thickness T1 of the first dielectric layer 301. The second dielectric layer 303 may be formed by, for example, chemical vapor deposition, plasma enhanced chemical vapor deposition. In some embodiments, the second dielectric layer 303 may be deposited using a silicate or silicon source, a number of doping sources, and an ozone source. The doped sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the second dielectric layer 303. In some embodiments, the doping sources of the first dielectric layer 301 and the doping sources of the second dielectric layer 303 may be the same. As a result, the first dielectric layer 301 and the second dielectric layer 303 may include the same impurity atoms. In some embodiments, the concentration of atoms of the second dielectric layer 303 may be greater than the concentration of atoms of the first dielectric layer 301.

Figure 15:
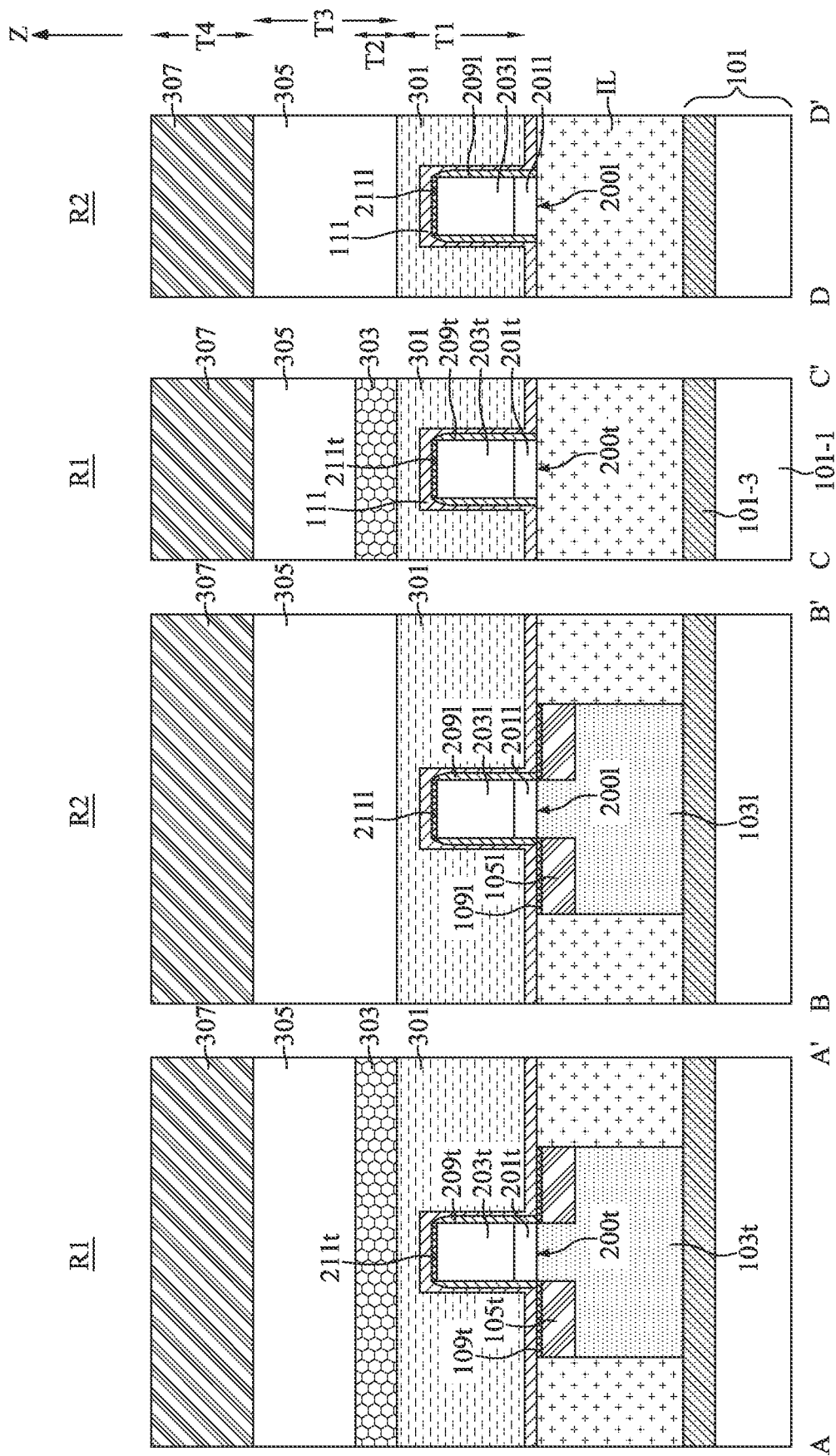

With reference to FIG. 15, a mask layer (not shown) may be formed to cover the first dielectric layer 301 formed above the first region R1 of the substrate 101. The first dielectric layer 301 formed above the second region R2 of the substrate 101 may be exposed. An etch process, such as an anisotropic dry etch process, may be performed to remove the first dielectric layer 301 formed above the second region R2 of the substrate 101. After the etch process, the first dielectric layer 301 formed above the second region R2 of the substrate 101 may be exposed and the mask layer may be removed.

With reference to FIG. 15, the third dielectric layer 305 may be formed to cover the second dielectric layer 303 formed above the first region R1 of the substrate 101 and the first dielectric layer 301 formed above the second region R2 of the substrate 101. A planarization process, such as chemical mechanical polishing, may be performed to remove excess material and provide a substantially flat surface for subsequent processing steps. In some embodiments, the third dielectric layer 305 may have a thickness T3 which is greater than the thickness T2 of the second dielectric layer 303. In some embodiments, the thickness T3 of the third dielectric layer 305 may be greater than or equal to the thickness T1 of the first dielectric layer 301.

In some embodiments, the third dielectric layer 305 may be formed by, for example, chemical vapor deposition, plasma enhanced chemical vapor deposition. In some embodiments, the third dielectric layer 305 may be deposited using a silicate or silicon source, a number of doping sources, and an ozone source. The doped sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the third dielectric layer 305. In some embodiments, the doping sources of the third dielectric layer 305 and the doping sources of the second dielectric layer 303 may be different. As a result, the third dielectric layer 305 and the second dielectric layer 303 may include different impurity atoms.

With reference to FIG. 15, the fourth dielectric layer 307 may be formed on the third dielectric layer 305. In some embodiments, the fourth dielectric layer 307 may have a thickness T4 greater than or equal to the thickness T3 of the third dielectric layer 305. The thickness T4 of the fourth dielectric layer 307 may be greater than the thickness T2 of the second dielectric layer 303. The fourth dielectric layer 307 may be formed by, for example, chemical vapor deposition, plasma enhanced chemical vapor deposition. In some embodiments, the fourth dielectric layer 307 may be deposited using a silicate or silicon source, a number of doping sources, and an ozone source. The doping sources may be, for example, triethylborate, triethylphosphate, triethyphosphite, trimethylphosphate, or trimethylphosphite. The silicate or silicon source may be, for example, tetramethylorthosilicate. The doping sources may result in impurity atoms such as phosphorus or boron in the fourth dielectric layer 307. In some embodiments, the doping sources of the fourth dielectric layer 307 and the doping sources of the third dielectric layer 305 may be the same. As a result, the fourth dielectric layer 307 and the third dielectric layer 305 may include the same impurity atoms. In some embodiments, the concentration of atoms of the fourth dielectric layer 307 may be greater than the concentration of atoms of the third dielectric layer 305.

Figure 16:
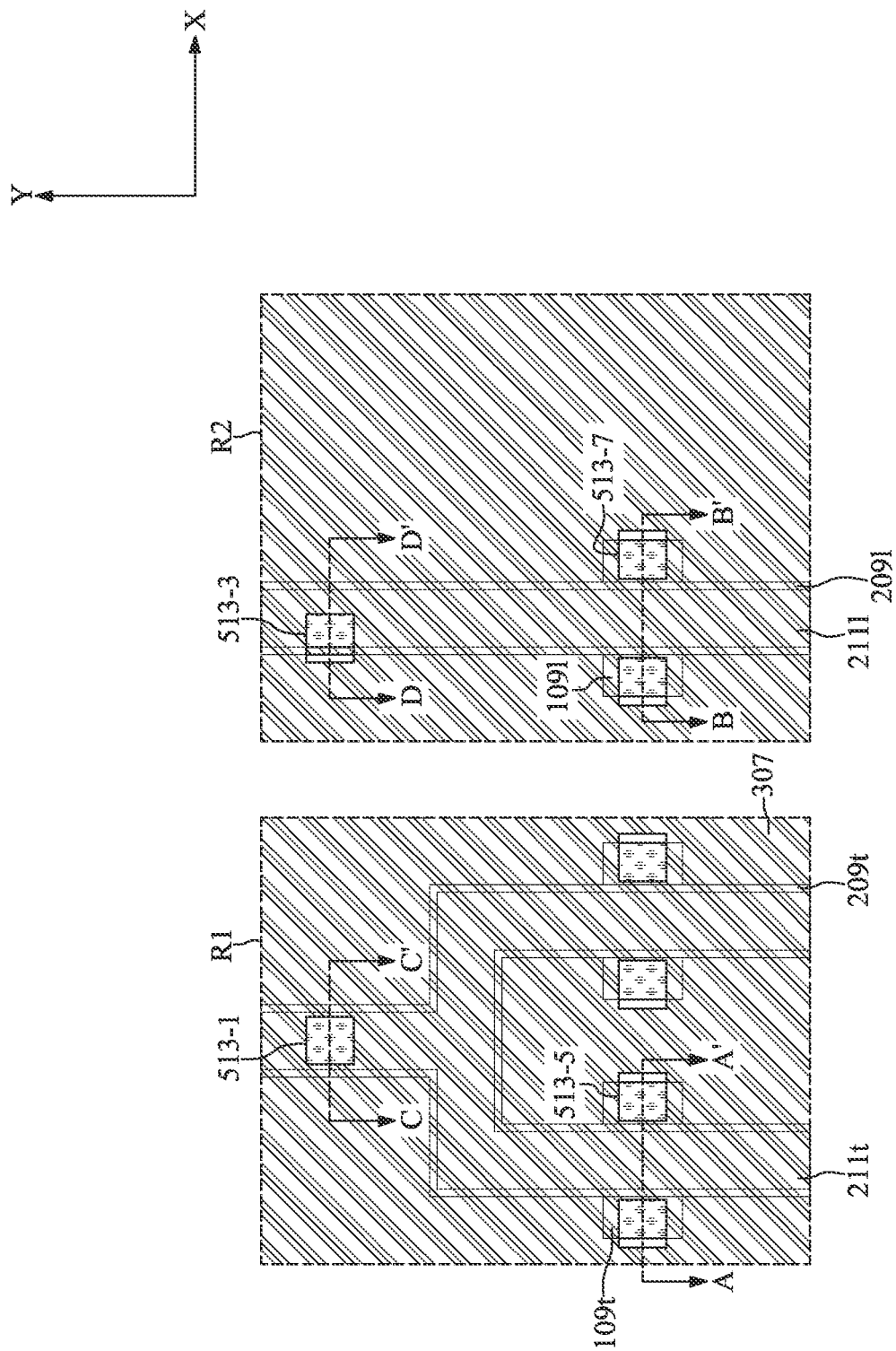
FIG. 16 illustrates, in a schematic top-view diagram, an intermediate semiconductor device in accordance with one embodiment of the present disclosure.
Figure 17:
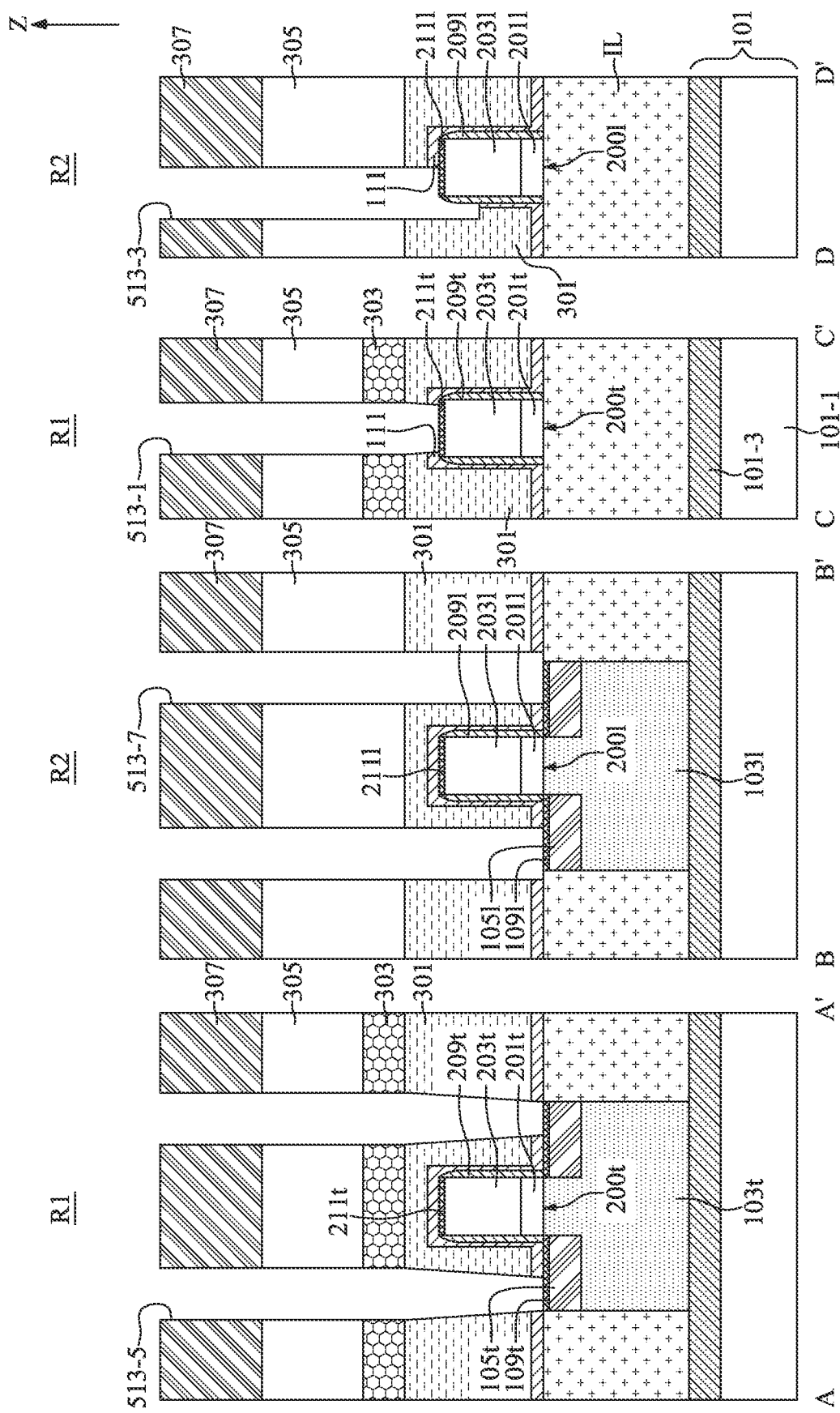
FIG. 17 illustrates, in a schematic cross-sectional view diagram taken along lines A-A', B-B', C-C', and D-D' in FIG. 16, respectively.
Figure 18:
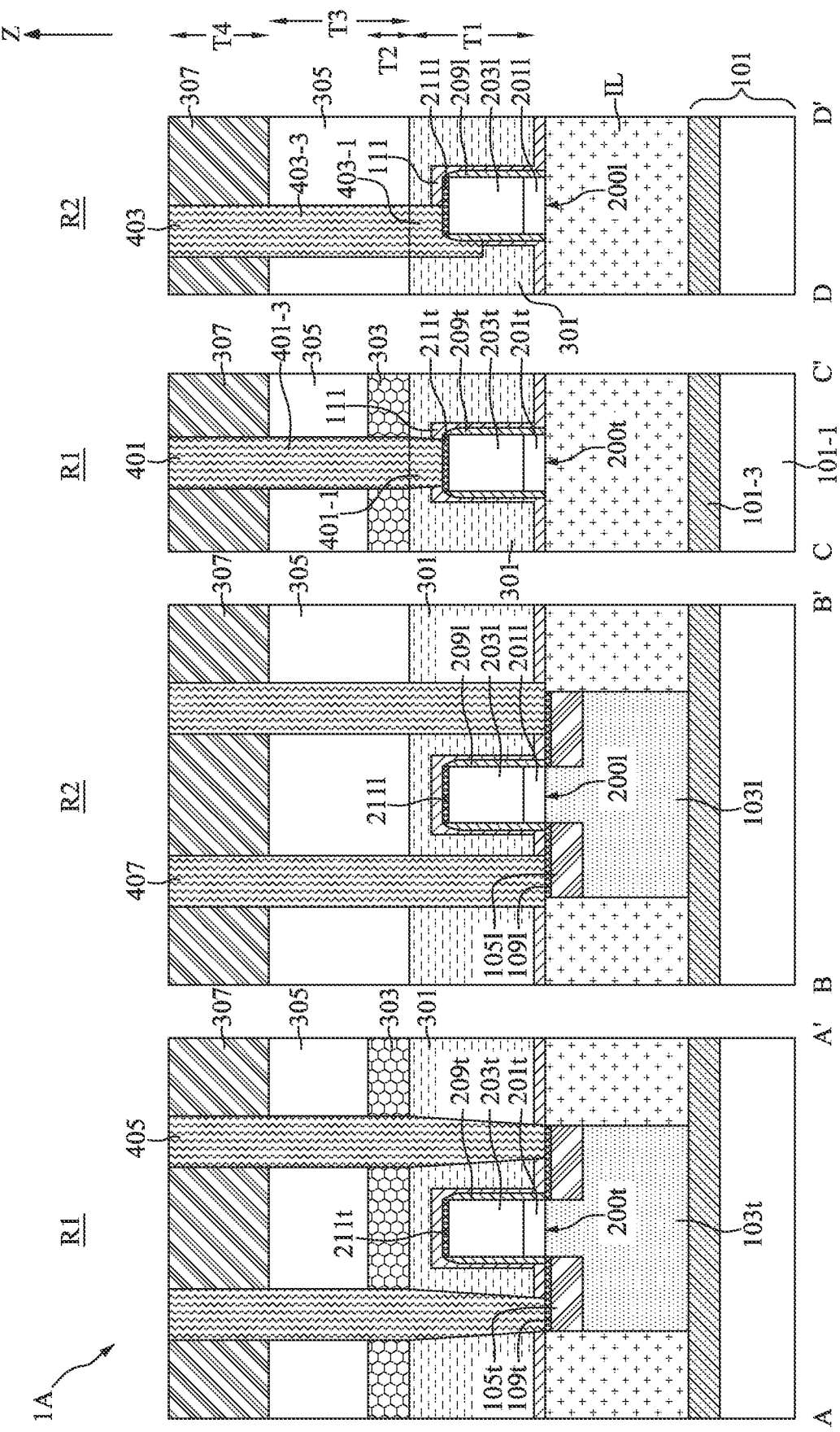
FIG. 18 illustrates, in a schematic cross-sectional view diagram, the semiconductor device in accordance with one embodiment of the present disclosure.

FIG. 16 illustrates, in a schematic top-view diagram, an intermediate semiconductor device in accordance with one embodiment of the present disclosure. FIG. 17 illustrates, in a schematic cross-sectional view diagram taken along lines A-A', B-B', C-C', and D-D' in FIG. 16, respectively. FIG. 18 illustrates, in a schematic cross-sectional view diagram, the semiconductor device 1A in accordance with one embodiment of the present disclosure.

With reference to FIG. 1 and FIGS. 16 to 18, at step S19, a first contact 401 and a second contact 403 may be formed on the plurality of top gate conductive layers 211t, 211l, and a plurality of third contacts 405 and a plurality of fourth contacts 407 may be formed on the plurality ohmic contact layers 109t, 109l.

With reference to FIGS. 16 and 17, a mask layer (not shown) may be formed on the fourth dielectric layer 307 to define the positions and the patterns of the first contact 401, the second contact 403, the plurality of third contacts 405, and the plurality of fourth contacts 407. An etch process, such as an anisotropic dry etch process, may be performed to form a plurality of contact openings 513-1, 513-3, 513-5, 513-7.

Due to the concentration of atoms of dielectric layers may affect the etching behavior during the etch process so as to determine the profile of contact opening. By using different concentration of atoms of dielectric layers and different stack configuration of the dielectric layer at the first region R1 and the second region R2, contact openings with different profiles may be formed in different regions. Generally, dielectric layer with low concentration of atoms may have tapered sidewall profile. Dielectric layer with high concentration of atoms may have substantially vertical sidewall profile.

Specifically, the contact opening 513-1 may be located above the first region R1 of the substrate 101. The contact opening 513-1 may be formed along the fourth dielectric layer 307, the third dielectric layer 305, the second dielectric layer 303, the first dielectric layer 301, and the capping layer 111 to expose the top gate conductive layer 211t. The sidewalls of the contact opening 513-1 consisting of the fourth dielectric layer 307, the third dielectric layer 305, and the second dielectric layer 303 may be substantially vertical. The sidewalls of the contact opening 513-1 consisting of the first dielectric layer 301 and the capping layer 111 may be tapered.

The contact opening 513-3 may be located above the second region R2 of the substrate 101. The contact opening 513-3 may be formed along the fourth dielectric layer 307, the third dielectric layer 305, the first dielectric layer 301, and the capping layer 111 to expose the top gate conductive layer 211l and a portion of the gate spacers 209l. The sidewalls of the contact opening 513-3 consisting of the fourth dielectric layer 307, the third dielectric layer 305, the first dielectric layer 301, and the capping layer 111 may be substantially vertical.

For brevity, clarity, and convenience of description, only one contact opening 513-5 is described. The contact opening 513-5 may be located above the first region R1 of the substrate 101. The contact opening 513-5 may be formed along the fourth dielectric layer 307, the third dielectric layer 305, the second dielectric layer 303, the first dielectric layer 301, and the capping layer 111 to expose the ohmic contact layer 109t. The sidewalls of the contact opening 513-5 consisting of the fourth dielectric layer 307, the third dielectric layer 305, and the second dielectric layer 303 may be substantially vertical. The sidewalls of the contact opening 513-5 consisting of the first dielectric layer 301 and the capping layer 111 may be tapered.

For brevity, clarity, and convenience of description, only one contact opening 513-7 is described. The contact opening 513-7 may be located above the second region R2 of the substrate 101. The contact opening 513-7 may be formed along the fourth dielectric layer 307, the third dielectric layer 305, the first dielectric layer 301, and the capping layer 111 to expose the ohmic contact layer 109l. The sidewalls of the contact opening 513-7 consisting of the fourth dielectric layer 307, the third dielectric layer 305, the first dielectric layer 301, and the capping layer 111 may be substantially vertical.

With reference to FIG. 18, the first contact 401, the second contact 403, the plurality of third contacts 405, and the plurality of fourth contacts 407 may be respectively correspondingly formed in the contact openings plurality of contact openings 513-1, 513-3, 513-5, 513-7. The first contact 401, the second contact 403, the plurality of third contacts 405, and the plurality of fourth contacts 407 may be formed by, for example, chemical vapor deposition, plasma enhanced chemical vapor deposition, physical vapor deposition, sputtering, or other suitable deposition method. The first contact 401, the second contact 403, the plurality of third contacts 405, and the plurality of fourth contacts 407 may be formed of, for example, copper, tungsten, aluminum, other suitable conductive material, or a combination thereof. A planarization process, such as chemical mechanical polishing, may be performed to remove excess material and provide a substantially flat surface for subsequent processing steps. The profiles of the first contact 401, the second contact 403, the plurality of third contacts 405, and the plurality of fourth contacts 407 may be inherited from the plurality of contact openings 513-1, 513-3, 513-5, and 513-7.

Specifically, the first contact 401 may be located above the first region R1 of the substrate 101 and may include a first lower portion 401-1 and a first upper portion 401-3. The first lower portion 401-1 may be formed on the top gate conductive layer 211t, in the first dielectric layer 301, and along the capping layer 111. The sidewalls of the first lower portion 401-1 may be tapered. The first upper portion 401-3 may be formed on the first lower portion 401-1 and along the fourth dielectric layer 307, the third dielectric layer 305, and the second dielectric layer 303. The sidewalls of the first upper portion 401-3 may be substantially vertical.

The second contact 403 may be located above the second region R2 of the substrate 101 and may include a second lower portion 403-1 and a second upper portion 403-3. The second lower portion 403-1 may be formed on the top gate conductive layer 211l and may include an extending part to cover a portion of the gate spacer 209l. The second lower portion 403-1 may be formed in the first dielectric layer 301 and along the capping layer 111.

For brevity, clarity, and convenience of description, only one third contact 405 is described. The third contact 405 may be located above the first region R1 of the substrate 101 and on the ohmic contact layer 109t. The sidewalls of the third contact 405 formed along the first dielectric layer 301 and the capping layer 111 may be tapered. The sidewalls of the third contact 405 formed along the fourth dielectric layer 307, the third dielectric layer 305, and the second dielectric layer 303 may be substantially vertical.

For brevity, clarity, and convenience of description, only one fourth contact 407 is described. The fourth contact 407 may be located above the second region R2 of the substrate 101 and on the ohmic contact layer 109*l*. The sidewalls of the fourth contact 407 formed along the first dielectric layer 301 and the capping layer 111 may be substantially vertical. The sidewalls of the fourth contact 407 formed along the fourth dielectric layer 307, the third dielectric layer 305, and the second dielectric layer 303 may be substantially vertical.

One aspect of the present disclosure provides a semiconductor device including a substrate including a first region and a second region; a first gate structure positioned on the first region of the substrate; and a second gate structure positioned on the second region of the substrate; a first contact including a first lower portion positioned on a top surface of the first gate structure, and a first upper portion positioned on the first lower portion; and a second contact including a second lower portion positioned on a top surface of the second gate structure and a sidewall of the second gate structure, and a second upper portion positioned on the second lower portion. Sidewalls of the first lower portion are tapered and sidewalls of the second lower portion are substantially vertical.

Another aspect of the present disclosure provides a method for fabricating a semiconductor device including providing a substrate including a first region and a second region; forming a gate structure on first region of the substrate and a second gate structure on the second region of the substrate; forming a first dielectric layer on the substrate to cover the first gate structure; forming a second dielectric layer on the first dielectric layer and above the first region of the substrate; forming a first contact including a first lower portion along the first dielectric layer and contacting a top surface of the first gate structure, and a first upper portion along the second dielectric layer and on the first lower portion; and forming a second contact including a second lower portion contacting a top surface of the second gate structure and a sidewall of the second gate structure, and a second upper portion on the second lower portion. The first dielectric layer includes atoms including phosphorus, arsenic, antimony, or boron. Sidewalls of the first lower portion are tapered and sidewalls of the second lower portion are substantially vertical.

Due to the design of the semiconductor device of the present disclosure, the tapered profile of the contacts 401, 405 fabricated by designated dielectric layers with different concentration of atoms and stack configuration may reduce leakage current between adjacent elements at the first region R1 (i.e., the tight region). As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a substrate comprising a first region and a second region;
    a first gate structure positioned on the first region of the substrate; and
    a second gate structure positioned on the second region of the substrate;
    a first contact comprising:
        a first lower portion positioned on a top surface of the first gate structure; and
        a first upper portion positioned on the first lower portion; and
    a second contact comprising:
        a second lower portion positioned on a top surface of the second gate structure and a sidewall of the second gate structure; and
        a second upper portion positioned on the second lower portion;
    a first dielectric layer positioned on the first region of the substrate;
    a second dielectric layer positioned on the first dielectric layer;
    wherein sidewalls of the first lower portion are tapered and sidewalls of the second lower portion are substantially vertical;
    wherein the first gate structure and the first lower portion are positioned in the first dielectric layer;
    wherein the first dielectric layer comprises atoms comprising phosphorus, arsenic, antimony, or boron;
    wherein the first upper portion is positioned along the second dielectric layer;
    wherein the second dielectric layer comprises atoms comprising phosphorus, arsenic, antimony, or boron;
    wherein a concentration of atoms of the second dielectric layer is greater than a concentration of atoms of the first dielectric layer.

2. The semiconductor device of claim 1, further comprising a third dielectric layer positioned on the second dielectric layer;
    wherein the third dielectric layer comprises atoms comprising phosphorus, arsenic, antimony, or boron.

3. The semiconductor device of claim 2, further comprising a fourth dielectric layer positioned on the third dielectric layer;
    wherein the fourth dielectric layer comprises atoms comprising phosphorus, arsenic, antimony, or boron;
    wherein a concentration of atoms of the fourth dielectric layer is greater than a concentration of atoms of the third dielectric layer.

4. The semiconductor device of claim 1, wherein the first dielectric layer and the second dielectric layer comprise a same type of atoms.

5. The semiconductor device of claim 3, wherein the third dielectric layer and the fourth dielectric layer comprise a same type of atoms.

6. The semiconductor device of claim 1, further comprising a capping layer covering the first gate structure and the second gate structure;

wherein the first lower portion is positioned along the capping layer and contacting the top surface of the first gate structure;

wherein the second lower portion is positioned along the capping layer and contacting the top surface of the second gate structure.

7. The semiconductor device of claim 1, wherein the first dielectric layer is positioned on the second region of the substrate; and wherein the second gate structure and the second lower portion are positioned in the first dielectric layer.

8. The semiconductor device of claim 7, further comprising a third dielectric layer positioned on the first dielectric layer;

wherein the third dielectric layer comprises atoms comprising phosphorus, arsenic, antimony, or boron.

9. The semiconductor device of claim 1, wherein sidewalls of the first upper portion and sidewalls of the second upper portion are substantially vertical.

10. The semiconductor device of claim 1, further comprising a plurality of gate spacers positioned on the sidewalls of the first gate structure.

11. The semiconductor device of claim 1, wherein the first gate structure comprises:

a gate insulation layer positioned on the first region of the substrate; and a bottom gate conductive layer positioned on the gate insulation layer;

wherein the first lower portion is contacting the bottom gate conductive layer.

12. The semiconductor device of claim 11, further comprising an ohmic contact layer positioned between the bottom gate conductive layer and the first lower portion;

wherein the ohmic contact layer comprises titanium silicide, nickel silicide, nickel platinum silicide, tantalum silicide, or cobalt silicide.

13. The semiconductor device of claim 1, wherein a thickness of the second dielectric layer is less than a thickness of the first dielectric layer.

14. The semiconductor device of claim 2, wherein a thickness of the third dielectric layer is greater than a thickness of the second dielectric layer.

15. The semiconductor device of claim 3, wherein a thickness of the fourth dielectric layer is greater than a thickness of the second dielectric layer.

16. The semiconductor device of claim 1, wherein an element density of the first region of the substrate is greater than an element density of the second region of the substrate.

17. A method for fabricating a semiconductor device, comprising:

providing a substrate comprising a first region and a second region;

forming a first gate structure on first region of the substrate and a second gate structure on the second region of the substrate;

forming a first dielectric layer on the substrate to cover the first gate structure, wherein the first dielectric layer comprises atoms comprising phosphorus, arsenic, antimony, or boron;

forming a second dielectric layer on the first dielectric layer and above the first region of the substrate;

forming a first contact comprising:
 a first lower portion along the first dielectric layer and contacting a top surface of the first gate structure; and
 a first upper portion along the second dielectric layer and on the first lower portion; and forming a second contact comprising:
 a second lower portion contacting a top surface of the second gate structure and a sidewall of the second gate structure; and
 a second upper portion on the second lower portion;

forming a third dielectric layer on the second dielectric layer, wherein the third dielectric layer comprises atoms comprising phosphorus, arsenic, antimony, or boron; and forming a fourth dielectric layer positioned on the third dielectric layer, wherein the fourth dielectric layer comprises atoms comprising phosphorus, arsenic, antimony, or boron;

wherein sidewalls of the first lower portion are tapered and sidewalls of the second lower portion are substantially vertical;

wherein a concentration of atoms of the second dielectric layer is greater than a concentration of atoms of the first dielectric layer;

wherein a concentration of atoms of the fourth dielectric layer is greater than a concentration of atoms of the third dielectric layer.

* * * * *